(12) United States Patent
Buchholz et al.

(10) Patent No.: US 9,822,299 B2
(45) Date of Patent: Nov. 21, 2017

(54) FLUORINE-FLUORINE ASSOCIATES

(75) Inventors: Herwig Buchholz, Frankfurt am Main (DE); Junyou Pan, Frankfurt am Main (DE); Rémi Manouk Anémian, Seoul (KR)

(73) Assignee: Merck Patent GmbH, Darmstadt (DE)

( * ) Notice: Subject to any disclaimer, the term of this patent is extended or adjusted under 35 U.S.C. 154(b) by 936 days.

(21) Appl. No.: 13/580,841

(22) PCT Filed: Jan. 27, 2011

(86) PCT No.: PCT/EP2011/000364
§ 371 (c)(1),
(2), (4) Date: Aug. 23, 2012

(87) PCT Pub. No.: WO2011/103953
PCT Pub. Date: Sep. 1, 2011

(65) Prior Publication Data
US 2012/0313087 A1    Dec. 13, 2012

(30) Foreign Application Priority Data

Feb. 24, 2010    (DE) .................. 10 2010 009 193

(51) Int. Cl.
| C09K 11/06 | (2006.01) |
| H01L 51/54 | (2006.01) |
| H01L 51/00 | (2006.01) |
| H05B 33/14 | (2006.01) |
| C09B 23/14 | (2006.01) |
| C09B 57/00 | (2006.01) |
| C09B 57/10 | (2006.01) |
| C09B 69/10 | (2006.01) |
| H01L 51/50 | (2006.01) |

(52) U.S. Cl.
CPC ............ *C09K 11/06* (2013.01); *C09B 23/148* (2013.01); *C09B 57/00* (2013.01); *C09B 57/10* (2013.01); *C09B 69/109* (2013.01); *H01L 51/0039* (2013.01); *H01L 51/0043* (2013.01); *H01L 51/0085* (2013.01); *H05B 33/14* (2013.01); *C09K 2211/1007* (2013.01); *C09K 2211/1011* (2013.01); *C09K 2211/1014* (2013.01); *C09K 2211/1029* (2013.01); *C09K 2211/1416* (2013.01); *C09K 2211/1425* (2013.01); *C09K 2211/1433* (2013.01); *C09K 2211/185* (2013.01); *H01L 51/0094* (2013.01); *H01L 51/5012* (2013.01); *H01L 51/5016* (2013.01); *H01L 51/5036* (2013.01); *Y02E 10/549* (2013.01)

(58) Field of Classification Search
CPC ............. H01L 51/0039; H01L 51/0043; H01L 51/0085; H01L 51/0094; H01L 51/5036; H01L 51/50; H01L 51/5012; H01L 51/5016; C09K 11/06; C09K 2211/1007; C09K 2211/1011; C09K 2211/1014; C09K 2211/185; C09K 2211/1416; C09K 2211/1425; C09K 2211/1433
See application file for complete search history.

(56) References Cited

U.S. PATENT DOCUMENTS

| 2003/0091862 | A1* | 5/2003 | Tokito et al. ................. 428/690 |
| 2003/0124381 | A1* | 7/2003 | Thompson et al. .......... 428/690 |
| 2003/0189216 | A1 | 10/2003 | Kamatani et al. |
| 2005/0196775 | A1* | 9/2005 | Swager et al. ......... C08G 61/02 435/6.14 |
| 2006/0163562 | A1* | 7/2006 | Boerner .............. H01L 51/0039 257/40 |
| 2007/0152189 | A1* | 7/2007 | Li et al. ............. C09K 19/3488 252/299.01 |
| 2008/0093283 | A1* | 4/2008 | Hogen-Esch et al. . B01J 20/261 210/198.2 |
| 2008/0299414 | A1* | 12/2008 | Watanabe et al. .. C07F 15/0033 428/690 |
| 2011/0037058 | A1* | 2/2011 | Buchholz et al. .... C08F 214/18 257/40 |
| 2011/0095283 | A1* | 4/2011 | Buchholz et al. ..... C09K 11/06 257/40 |
| 2011/0175066 | A1* | 7/2011 | Sakuma et al. ........ C09K 11/06 257/40 |

FOREIGN PATENT DOCUMENTS

| JP | 2004/288381 A | 10/2004 |
| WO | WO-02/02714 A2 | 1/2002 |
| WO | WO 2009/053089 A1 * | 4/2009 |
| WO | WO 2010/025802 A1 * | 3/2010 |

OTHER PUBLICATIONS

Kim et al. "White-light-emitting diodes based on iridium complexes via efficient energy transfer from a conjugated polymer." Adv. Funct. Mater. 2006. vol. 16, pp. 611-617.*
Giovanella, U., et al., "Electroluminescence from Two Fluorinated Organic Emitters Embedded in Polyvinylcarbazole", Applied Physics Letters, vol. 87, , No. 17, (2005), pp. 171910-1-171910-3.
International Search Report for PCT/EP2011/000364 dated Mar. 22, 2011.

\* cited by examiner

*Primary Examiner* — Marie R. Yamnitzky

(57) ABSTRACT

The present invention relates, inter alia, to compositions comprising, a compound which is able to emit and/or absorb light and a compound which is able either to absorb or emit light, where both compounds each include at least one fluorine radical. The present invention is furthermore directed to a process for the preparation of the composition, to the use of the composition in electronic devices and to the device itself.

11 Claims, 1 Drawing Sheet

FLUORINE-FLUORINE ASSOCIATES

RELATED APPLICATIONS

Figure 1:
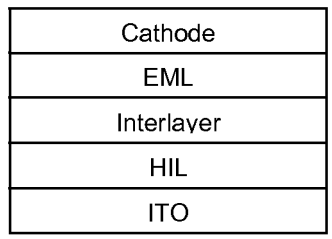

This application is a national stage application (under 35 U.S.C. §371) of PCT/EP2011/000364, filed Jan. 27, 2011, which claims benefit of German Patent Application No. 10 2010 019 193.6, filed Feb. 24, 2010.

The present invention relates, inter alia, to compositions comprising at least two fluorinated compounds M1 and M2 which either emit light or absorb light The present invention is furthermore directed to a process for the preparation of the composition, to the use of the composition in an electronic and/or opto-electronic devices and to the devices themselves.

Electronic devices which comprise organic, organometallic and/or polymeric semiconductors are being used ever more frequently in commercial products. Examples which may be mentioned here are organic-based charge-transport materials (in general triarylamine-based hole transporters) in photocopiers and organic or polymeric light-emitting diodes (OLEDs or PLEDs) in display devices or organic photoreceptors in copiers. Organic solar cells (O-SCs), organic field-effect transistors (O-FETs), organic thin-film transistors (O-TFTs), organic integrated circuits (O-ICs), organic optical amplifiers or organic laser diodes (O-lasers) are at an advanced stage of development and may achieve major importance in the future.

Many of these electronic and opto-electronic devices have, irrespective of the particular application, the following general layer structure, which can be adapted to the particular application:
(1) substrate,
(2) electrode, frequently metallic or inorganic, but also made from organic or polymeric conductive materials;
(3) possibly a charge-injection layer or interlayer for compensation of unevenness of the electrode or substrates ("planarisation layer"), frequently made from a conductive, doped polymer,
(4) functional layer having at least one organic-functional material,
(5) possibly a further charge-transport or charge-injection or chargeblocking layer,
(6) counterelectrode, materials as mentioned under (2),
(7) possibly an encapsulation.

The above arrangement represents the general structure of an opto-electronic device, where various layers can be combined, so that, in the simplest case, an arrangement comprising two electrodes, between which an organic layer is located, results. The organic layer in this case fulfils all functions, including the emission of light. A system of this type is described, for example, in WO 9013148 A1 based on poly(p-phenylenes).

A problem which arises in a "three-layer system" of this type is, however, the lack of a possibility to optimise the individual constituents in different layers with respect to their properties, as is solved easily, for example, in the case of SMOLEDs ("small-molecule OLEDs") through a multilayered structure. A "small molecule OLED" consists, for example, of one or more organic hole-injection layers, hole-transport layers, emission layers, electron-transport layers and electron-injection layers as well as an anode and a cathode, where the entire system is usually located on a glass substrate. An advantage of a multilayered structure of this type consists in that various functions of charge injection, charge transport and emission can be divided into the various layers and the properties of the respective layers can thus be modified separately.

The layers in SMOLED devices are usually applied by vapour deposition in a vacuum chamber. However, this process is complex and thus expensive and is unsuitable, in particular, for large molecules, such as, for example, polymers, but also for many small molecules, which frequently decompose under the vapour-deposition conditions.

The application of layers from solution is therefore advantageous, where both small molecules and also oligomers or polymers can be processed from solution.

However, OLEDs which are processed from solution still have a number of disadvantages compared with SMOLEDs. One problem which has arisen here that a number of components usually have to be combined in one layer to form a so-called mixed multicomponent layer, since the application of a plurality of layers from solution frequently have negative effects on the layers previously applied.

In the conventional process for OLED production, both by deposition from the gas phase or solution-processed, it is difficult to control the distribution of the individual components. The components are usually distributed randomly. For some physical properties of such systems, however, controlled distribution of individual components is desired, for example in the case of so-called double doping in triplet systems (see Kawamura, Y.; Yanagida, S.; Forrest, S. R., "Energy transfer in polymer electro phosphorescent light emitting device with single and multiple doped luminescent layers", J. Appl. Phys., 92 (1), 87-93, 2002). It is reported therein that a very efficient polymer (PHOLED) is produced by using poly(9-vinylcarabazole) (PVK) as host molecule, which is doped with one or more phosphorescent cyclometallated Ir(III) complexes. It is usually assumed that energy transfer in accordance, for example, with the Förster mechanism takes place in the case of double doping. Further photophysical mechanisms (for example Dexter energy transfer, radiation transfer, i.e. emission and subsequent reabsorption) of energy transfer are known and play a role here.

Energy transfer requires spatial proximity of the molecular groups. Thus, it is known that the Förster energy transfer rates are given approximately by the following formula:

$$\Gamma_{DA} \propto 1/R^6,$$

where R represents the separation between the donor and the acceptor. This separation is usually also known as the Förster radius. In order to facilitate efficient Förster energy transfer, it is thus necessary to position the donor and acceptor, i.e. the two emitter compounds or metal complexes, as close as possible, advantageously within the Förster radius.

The fact that the two emitters are usually distributed randomly means that the requisite small separation of the two emitter molecules from one another (donor and acceptor) is not guaranteed to the full extent.

A further major problem in the case of solution-based SMOLEDs is the film-formation property. The materials used are frequently very readily soluble in a solvent and can be applied to the substrate, for example, by ink-jet printing. However, many materials do not exhibit good film-formation properties, caused by the high mobility of the small molecules in the solvent.

An object of the present invention consisted in the provision of a composition in which donor and acceptor compounds can be positioned at a close separation from one another. This should be carried out, in particular, in respect of solution-based systems.

A further object of the present invention consisted in the provision of a process in which the mobility of the small molecules in solvents is restricted and thus better film-formation properties are achieved.

The solar spectrum has a maximum photon flux in the infrared region of the spectrum. For this reason, it is particularly advantageous to design solar cells to absorb the photons of these long wavelengths and to transform them into energy which is usable by humans. The experiments on the design of narrow-band-gap polymers (Chitoshi Kitamura et al., In Chem. Mater. 1996, 8, 570-578) and of "low band gap polymers for organic photovoltaics" (F. C. Krebs, in Solar Energy Materials and Solar Cells, Vol91, pp 954 (2007) served this purpose. Low-band gap polymers of this type exhibit maximum absorption in the long-wave region of the solar spectrum, but cannot absorb the energies of shorter wavelength completely or at all.

A further object of the present invention is therefore to provide compositions which exhibit an improved absorption profile and are therefore particularly suitable for use in solar cells.

Surprisingly, it has been found that the above-mentioned objects can be achieved by the specific use of a fluorine-fluorine interaction between the emitter or absorber molecules. The fluorine-fluorine interaction exerts a strong adhesive force on the two molecules, so that they are on the one hand immobilised and on the other hand donor and acceptor compound come so close that they are located, for example, within the Förster radius. Zhao et al. report in Org. Lett., 10 (14), 3041-3044, 2008, a fluorescent conjugated dendrimer having fluorinated terminal groups, nanofibre formation and electroluminescent properties thereof.

Furthermore, Zhao et al. in J. Phys. Chem. C, 112 (23), 8511-8515, 2008, reports a further strongly fluorescent, fluorinated carbazole, where OLEDs were obtained which emit a blue light through excimer formation and an orange light via electromers at high voltage.

Ge et al. in Chem. Lett. 37 (3), 294-295, 2008, reports an efficient PHOLED using fluorinated carbazoles (6 FCPB) as matrix.

WO 2007/145976 and WO 2007/145975 disclose processes for the production of multicoloured OLEDs comprising first subpixel regions and second subpixel regions which enable the formation of a structured anode on a substrate and the formation of an unstructured continuous hole-injection layer comprising a conductive polymer and a fluorinated acidic polymer over the anode, so that essentially no interaction can be observed between the first subpixels and the second subpixels.

Neilson et al. in "J. Mixed Chromophore Perfluorocyclobutyl PFCB Copolymers for Tailored Light Emission", Abstracts 59th Southeast Regional Meeting of the American Chemical Society, Greenville, S.C., United States, October 24 to 27, GEN-041, 2007, report mixed choromophore perfluorocyclobutyl PFCB copolymers, where the aim is to reduce aggregation and prevent excimer formation, which resulted in an increase in the electroluminescence brightness and a reduced operating voltage.

Fluorinated copper phthalocyanines are disclosed in "Giovanella et al., Appl. Phys. Lett., 87 (17), 171910 to 1-171910/3, 2005" for use as hole-injection layer in a UV-OLED.

In Appl. Phys. Lett., 87 (17), 171910 to 1-171910/3, 2005, Giovallena et al discloses OLEDs which are based on two fluorinated dyes which emit in the blue and green regions. These are mixed with polyvinylcarbazole and an oxadiazole, but a mixture or composition comprising two dyes is not disclosed.

WO 2003/077609 and U.S. Pat. No. 6,812,497 disclose a fluorinated OLED having long lifetimes which comprise, in an emission layer, a first and second compound, where both have at least one fluorine atom in the molecule or recurring unit. U.S. Pat. No. 6,812,497 preferably discloses a fluorinated host which is doped with a fluorinated metal complex.

Further metal complexes having fluorinated ligands, but no mixture comprising two different fluorinated emitter pairs, are disclosed, for example, in US 2007/278939 A1; Mol. Cryst. Liq. Cryst. 491, 209 to 216, 2008; Chin. Chem. Lett. 17 (3), 411 to 414, 2006; Synth. Met. 111-112, 485 to 487, 2000; Proc. SPIE-Int. Soc. Opt. Eng. 4800 (Organic Light Emitting Materials and Devices VI), 105 to 114, 2003 and Gho et al. Abstracts of Papers, 221st ACS National Meeting, San Diego, Calif., United States, Apr. 1 to 5, 2001.

The present invention relates to intermolecular associates between at least two organic-functional materials. Particular preference is given here to associates between four, in particular between three and very particularly between 2 different organic-functional materials. The term organic-functional is defined below in the present invention. Particular preference is given in the sense of the present invention to associates which comprise organic-functional materials which are fluorinated. For the purposes of the present invention, particular preference is given to associates which comprise two different organic-functional materials, each of which contains a fluorine radical. The definition of the fluorine radicals can be found below in the present invention. Very particular preference is given in the sense of the invention to associates which comprise two different emitter materials, each of which contains at least one fluorine radical and preferably each of which contains one fluorine radical.

Preference is furthermore given in the sense of the invention to associates which comprise an emitter material and a light-absorbent material (absorber), each of which contains at least one fluorine radical and preferably each contains one fluorine radical.

Preference is furthermore given in the sense of the invention to associates which comprise two light-absorbent materials (absorbers), each of which contains at least one fluorine radical and preferably each contains one fluorine radical.

The present invention furthermore relates to a composition comprising at least one light-absorbent or light-emitting compound M1 and at least one light-emitting or light-absorbent compound M2, characterised in that M1 and M2 are different from one another and both each contain at least one fluorine radical.

In a preferred embodiment of the present invention, the composition comprises precisely one compound M1 and one compound M2. It is preferred in accordance with the present invention for the two compounds M1 and M2 to absorb light having a wavelength between 250 and 1000 nm. It is furthermore preferred for the two compounds to emit light having a wavelength between 250 and 1000 nm.

Particular preference is given to an embodiment of the present invention in which the two molecules M1 and M2 have emission spectra which are different from one another.

The present invention furthermore relates to a composition comprising an unfluorinated organic host compound, an emitter compound M1 and an emitter compound M2, where M1 and M2 each include at least one fluorine radical.

According to an advantageous embodiment of the invention, either the absorption spectrum of M1 overlaps with the emission spectrum of M2 or the absorption spectrum of M2 overlaps with the emission spectrum of M1, at least with one of its absorption and emission bands. The overlapping of absorption and emission bands of M1 and M2 ensures that energy transfer can take place.

As already mentioned, the energy transfer can take place by different mechanisms. Förster energy transfer, which was discovered by Theodor Förster in 1946, is a physical process in which energy is transferred from an excited dye (donor) to a second dye (acceptor) by dipole-dipole interactions with no radiation (see T. Förster, "Zwischenmolekulare Energiewanderung und Fluoreszenz" [Intermolecular Energy Migration and Fluorescence], Ann. Physic. 437, 1948, 55).

If mention is made below of Förster transfer or Förster radius, this is merely intended to ensure that the molecules (donor and acceptor) have a short separation from one another in order to facilitate energy transfer by one of the known photophysical mechanisms.

In a further preferred embodiment of the present invention, the composition comprises at least one fluorinated emitter M1 and at least one fluorinated dye M2.

The fluorinated emitter M1 can be selected from any emitter as described elsewhere in the present invention. In a very preferred embodiment, M1 has strong absorption in the region of UV radiation (250 to 380 nm), of blue light (381 to 490 nm) and of green or yellow light (491 to 580 nm) s light and preferably re-emits red light (591 to 730 nm) and infrared light (731 to 1100 nm). In a further preferred embodiment, M1 is a fluorinated metal complexes, which can be selected from the metal complexes described elsewhere in the present invention. In a particularly preferred embodiment, M1 is a fluorinated fluorescence emitter.

M2 can be selected from the group of small molecules, polymers, conjugated polymers and non-conjugated polymers, oligomers and dendrimers.

In a preferred embodiment, M2 is a polymer, and particularly preferably a conjugated polymer. Suitable conjugated polymers and their general design principle are summarised in, for example, F. C. Krebs, in Solar Energy Materials and Solar Cells, Vol91, pp 954 (2007) and in "Conjugated Polymer-Based Organic Solar Cells" by Serap Günes, et al., In Chem. Rev. 2007, 107, 1324-1338.

In a further preferred embodiment, M2 is selected from the group of dyes which can be used for dye-sensitised solar cells (DSSCs), such as, for example, ruthenium complexes and derivatives thereof, as reported, for example, by Yu Bai et. al., in Nature Materials, VOL7, pp 626 (2008), Angew. Chem. Int. Ed. 2005, 44, 5740-5744, and by B. O'Regan et. al., Nature 353, 737 (1991), and Cu complex, as reported by Takeru Bessho, et al., in Chem. Commun. 2008, 3717.

Further suitable dyes M2 having at least one fluorinated substituent are selected from the group of the azo dyes, phthalocyanines, including metal-free phthalocyanines, donor- or acceptor-doped metal-free phthalocyanines and metal phthalocyanines, porphyrins, squaraines, perylenediimides, perylene pigments, which have been grouped as charge generation materials (CGMs), by Paul M. Borsenberger, David S. Weiss Organic Photoreceptors for Xerography, Marcel Dekker, Inc., 1998, Chapter 6, and by K. Y. Law, Chem. Rev. Vol 93, 449-486 (1993) and polymeric materials which comprise one or more dyes.

In a particularly preferred embodiment, the dye is a perylene derivative, in small molecular form or in the form of a polymer, as disclosed, for example, in Angew. Chem. Int. Ed. 2006, 45, 3364-3368.

The present invention furthermore relates to the use of the compositions according to the invention in devices for organic photovoltaics.

M1 and M2 are each, independently of one another, a small molecule, a dimer, oligomer or a polymer. A small molecule in the sense of this invention is a molecule having a molecular weight of about up to 1000 u. A polymer in the sense of this invention is a compound which has 10 or more recurring units. Otherwise, the term dimer is used in the sense of this invention if two small molecules are covalently bonded to one another or the term oligomers is used if about 3 to 9 recurring units are present in the molecule.

The polymeric compounds according to the invention preferably have 10 to 10000, particularly preferably 20 to 5000 and in particular 50 to 2000 structural units. The branching factor of the polymers here is between 0 (linear polymer, no branching points) and 1 (fully branched dendrimer).

The term "dendrimer" in the present application is intended to be taken to mean a highly branched compound which is built up from a multifunctional centre (core), to which branched monomers are bonded in a regular structure, giving a tree-like structure. Both the centre and also the monomers can adopt any desired branched structures here which consist both of purely organic units and also organometallic compounds or coordination compounds. "Dendrimer" here is generally intended to be understood as described, for example, by M. Fischer and F. Vögtle (Angew. Chem., Int. Ed. 1999, 38, 885).

Both the weight-average molecular weight and number-average molecular weight of the polymers according to the invention are determined by gel permeation chromatography (GPC).

As already described above, it is particularly preferred for M1 and M2 to be at a separation from one another within the Förster radius. This is achieved in accordance with the invention through the emitter compound M1 and M2 being bonded to one another by adhesive F-F interactions via their fluorine radicals. Accordingly, they form intermolecular associates. The emitter compounds here come so close that effective energy transfer can take place.

In an embodiment of the invention, either M1 or M2 is covalently bonded to the organic host compound.

It is furthermore preferred in the sense of the invention that M1 and M2 are each, independently of one another, a fluorescent emitter or a phosphorescent emitter.

It is furthermore preferred in the sense of the invention that M1 and M2 are each different light-absorbent compounds.

A fluorescent emitter in the sense of this invention is a compound which emits light from an excited singlet state. A phosphorescent emitter is taken to mean a compound which exhibits luminescence from an excited state having relatively high spin multiplicity, i.e. a spin state >1, in particular from an excited triplet or quintet state or from an MLCT mixed state. Suitable phosphorescent compounds are metal complexes of transition metals. Suitable phosphorescent compounds are, in particular, compounds which emit light, preferably in the visible region, on suitable excitation and in addition contain at least one atom having the atomic numbers >38 and <84, particularly preferably >56 and <80. Preferred phosphorescence emitters are compounds which contain copper, molybdenum, tungsten, rhenium, ruthenium, osmium, rhodium, iridium, palladium, platinum, silver, gold or europium, in particular compounds which contain iridium, platinum or copper. Examples of the emitters described above are revealed by the applications WO 00/7065, WO 01/41512, WO 02/02714, WO 02/15645, EP 1191613, EP 1191612, EP 1191614, WO 05/033244. In general, all phosphorescent complexes as used in accordance with the prior art for phosphorescent OLEDs and as are known to the person skilled in the art in the area of organic electroluminescence are suitable.

In a further embodiment according to the invention, the phosphorescent emitter preferably comprises an organometallic compound unit. The organometallic compound unit is preferably an organometallic coordination compound. An organometallic coordination compound is taken to mean a compound having a metal atom or ion in the centre of the compound surrounded by an organic compound as ligand. An organometallic coordination compound is additionally characterised in that a carbon atom of the ligand is bonded to the central metal via a coordination bond.

It is furthermore preferred for the organic ligand to be a chelate ligand. A chelate ligand is taken to mean a bi- or multidentate ligand, which is able to bond to the central metal correspondingly via two or more atoms.

The organic ligand preferably includes a unit (referred to as ligand unit below) which is represented by the following formula (I):

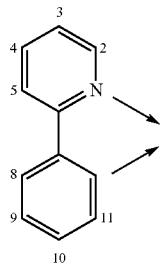

formula (I)

where the atoms from which the arrows point away are coordinated to the metal atom, and the numerals 2 to 5 and 8 to 11 merely represent a numbering in order to distinguish the C atoms. The organic ligand unit of the formula (I) may, instead of hydrogen at positions 2, 3, 4, 5, 8, 9, 10 and 11, have, independently of one another, a substituent which is selected from the group consisting of $C_{1-6}$-alkyl, $C_{6-20}$-aryl, 6- to 14-membered heteroaryl and further substituents.

The expression "$C_{1-6}$-alkyl" used herein denotes a linear or branched alkyl group having 1 to 6 carbon atoms. Examples of such carbon atoms are methyl, ethyl, n-propyl, isopropyl, n-butyl, isobutyl, sec-butyl (1-methylpropyl), tert-butyl, isopentyl, n-pentyl, tert-pentyl (1,1-dimethylpropyl), 1,2-dimethylpropyl, 2,2-dimethylpropyl (neopentyl), 1-ethylpropyl, 2-methylbutyl, n-hexyl, isohexyl, 1,2-dimethylbutyl, 1-ethyl-1-methylpropyl, 1-ethyl-2-methylpropyl, 1,1,2-trimethylpropyl, 1,2,2-trimethylpropyl, 1-ethylbutyl, 1-methylbutyl, 1,1-dimethylbutyl, 2,2-dimethylbutyl, 1,3-dimethylbutyl, 2,3-dimethylbutyl, 3,3-dimethylbutyl, 2-ethylbutyl, 1-methylpentyl, 2-methylpentyl, 3-methylpentyl and the like, where methyl and ethyl are preferred.

The expression "$C_{6-20}$-aryl" denotes an aromatic ring system having 6 to 20 carbon atoms. An aromatic or heteroaromatic ring system in the sense of the present invention is intended to be taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, $sp^3$-hybridised C, O, N, etc.

Aryl groups may be monocyclic or polycyclic, i.e. they may have one ring (for example phenyl) or two or more rings, which may also be condensed (for example naphthyl) or covalently linked (for example biphenyl), or contain a combination of condensed and linked rings. Preference is given to fully conjugated aryl groups.

Preferred aryl groups are, for example, phenyl, biphenyl, triphenyl, naphthyl, anthracene, binaphthyl, phenanthrene, dihydrophenanthrene, pyrene, dihydropyrene, chrysene, perylene, tetracene, benzopyrene, fluorene and indene.

A "5- to 14-membered heteroaryl" is taken to mean an aromatic group in which one or more carbon atom(s) has (have) been replaced by an N, O or S. Examples thereof include the following: 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene or combinations of these groups. The heteroaryl groups may also be substituted by alkyl, alkoxy, thioalkyl, fluorine, fluoroalkyl or further aryl or heteroaryl groups.

Further possible substituents on the ligand unit of the formula (I) are preferably selected from the group consisting of silyl, sulfo, sulfonyl, formyl, amine, imine, nitrile, mercapto, nitro, halogen, hydroxyl or combinations of these groups. Preferred substituents are, for example, solubility-promoting groups, such as alkyl or alkoxy, electron-withdrawing groups, such as fluorine, nitro or nitrile, or substituents for increasing the glass transition temperature (Tg) in the polymer. Particularly preferred substituents are, for example, F, Cl, Br, I, —CN, —NO$_2$, —NCO, —NCS, —OCN, —SCN, —C(=O)N(R)$_2$, —C(=O)R, —C(=O)R and —N(R)$_2$, in which R is a hydrogen, alkyl or aryl, optionally substituted silyl, aryl having 4 to 40, preferably 6 to 20, C atoms, and straight-chain or branched alkyl, alkoxy, alkylcarbonyl, alkoxycarbonyl, alkylcarbonyloxy or alkoxycarbonyloxy having 1 to 22 C atoms, in which one or more H atoms may optionally be replaced by F or Cl.

It is furthermore preferred for two adjacent carbon atoms on the phenyl ring or pyridyl ring of the ligand unit of the formula (I) to be bridged via a group —CH=CH—CH=CH—, where, in the case of the phenyl ring, a naphthyl unit forms and, in the case of the pyridyl ring, an azanaphthyl unit forms. These may in turn carry via a further group —CH=CH—CH=CH— bridging via two adjacent carbon atoms. In a further preferred embodiment, the carbon atoms at positions 5 and 8 are bridged via a group —CH=CH—CH=CH—.

Preferred examples of the ligands of the formula (I) are the following compounds (I-1) to (I-8):

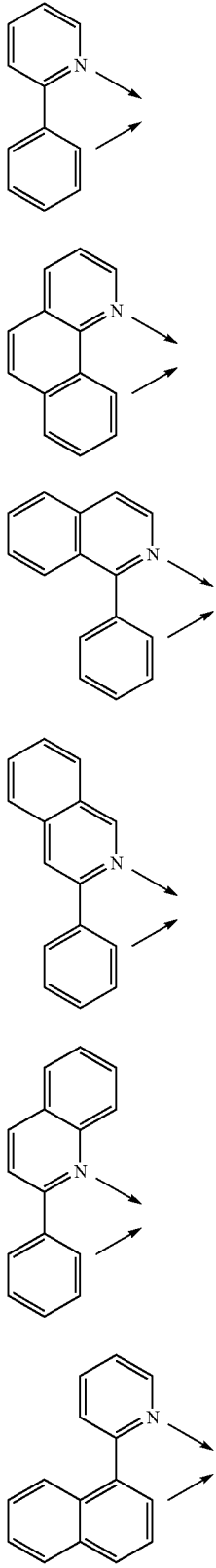

(I-1)
(I-2)
(I-3)
(I-4)
(I-5)
(I-6)

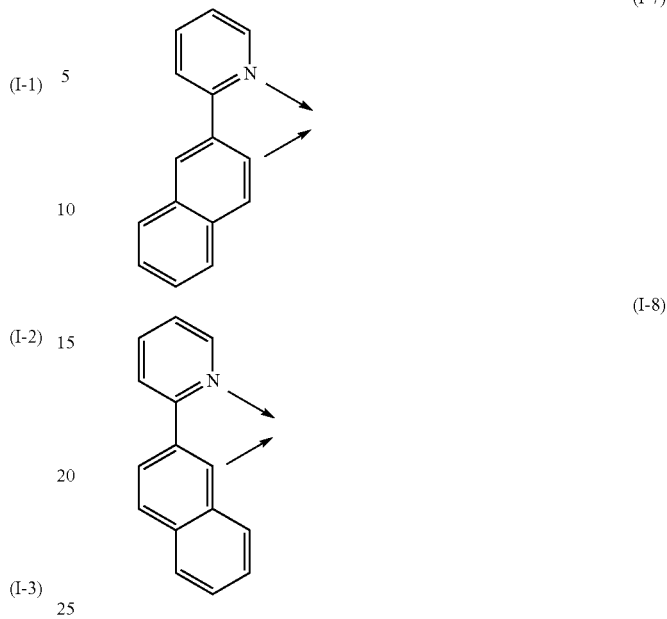

(I-7)
(I-8)

Greater preference is given in the sense of the present invention to the compounds (I-1) and (I-3).

The metal centre of the organic coordination compound is preferably a metal atom in oxidation state 0.

In a preferred embodiment, the metal centre is Pt or Ir. If the metal centre is Pt, it preferably has the coordination number 4. In the case of Ir as metal centre, the coordination number is preferably 6.

It is furthermore preferred for Pt to be coordinated by two ligand units of the formula (I) and Ir to be coordinated by three ligand units of the formula (I) in the manner indicated above.

Compounds M1 and M2 preferably have a fluorine radical. The fluorine radical is preferably bonded to M1 and M2 via a spacer. Suitable spacers are, for example, alkyl groups, preferably having 3 to 9 C atoms, aryl groups and heteroaryl groups.

In the sense of this invention, the fluorine radicals of compounds M1 and M2 preferably have the general formula $C_xH_yF_z$, where $x\geq 0$, $y\geq 0$ and $z\geq 1$, and no, one or more $CH_2$ groups, which may also be adjacent, may be replaced by O, S, Se, Te, $Si(R^1)_2$, $Ge(R^1)_2$, $NR^1$, $PR^1$, CO, $P(R^1)O$, where $R^1$ is on each occurrence, identically or differently, a straight-chain or branched or cyclic alkyl, alkenyl, alkynyl, aryl, arylalkyl, arylalkenyl, arylalkynyl, heteroaryl or heteroalkyl group, where, in addition, one or more non-adjacent C atoms of the non-aromatic components may be replaced by O, S, COO, OCO, with the proviso that two radicals $R^1$ may also form ring systems with one another. Preferred groups include, for example, F, $CF_3$, $C_2F_5$, $CF_3(CH_2)_aS$, $CF_3CF_2S$ or $(CF_3\text{-}(CH_2)_a)_2N$, where a preferably represents an integer from 0 to 5.

Preferred fluorine radicals in the sense of the invention are perfluorinated alkyl groups having 3 to 30 C atoms, particularly preferably having 4 to 20 C atoms and very particularly preferably having 5 to 15 C atoms.

Further preferred fluorine radicals are unbranched perfluorinated alkyl groups selected from the group $C_3F_7$, $C_4F_9$, $C_5F_{11}$, $C_6F_{13}$, $C_7F_{15}$, $C_8F_{17}$, $C_9F_{19}$, $C_{10}F_{21}$, $C_{11}F_{23}$, $C_{12}F_{25}$, $C_{13}F_{27}$, $C_{14}F_{29}$, $C_{15}F_{31}$, $C_{16}F_{33}$, $C_{17}F_{35}$, $C_{18}F_{37}$, $C_{19}F_{39}$, $C_{20}F_{41}$, $C_{21}F_{43}$, $C_{22}F_{45}$, $C_{23}F_{47}$, $C_{24}F_{49}$, $C_{25}F_{51}$, $C_{26}F_{53}$, $C_{27}F_{55}$, $C_{28}F_{57}$, $C_{29}F_{59}$, $C_{30}F_{61}$, particularly preferably $C_4F_9$, $C_5F_{11}$, $C_6F_{13}$, $C_7F_{15}$, $C_8F_{17}$, $C_9F_{19}$, $C_{10}F_{21}$, $C_{11}F_{23}$, $C_{12}F_{25}$, $C_{13}F_{27}$, $C_{14}F_{29}$, $C_{15}F_{31}$, $C_{16}F_{33}$, $C_{17}F_{35}$, $C_{18}F_{37}$, $C_{19}F_{39}$, $C_{20}F_{41}$, and very particularly preferably $C_5F_{11}$, $C_6F_{13}$, $C_7F_{15}$, $C_8F_{17}$, $C_9F_{19}$, $C_{10}F_{21}$, $C_{11}F_{23}$, $C_{12}F_{25}$, $C_{13}F_{27}$, $C_{14}F_{29}$, $C_{15}F_{31}$.

Further preferred fluorine radicals in the sense of the invention are the unbranched perfluorinated alkyl groups $C_4F_9$, $C_5F_{11}$, $C_6F_{13}$, $C_7F_{15}$, $C_8F_{17}$, $C_9F_{19}$, $C_{10}F_{21}$, in particular $C_6F_{13}$, $C_7F_{15}$, $C_8F_{17}$, $C_9F_{19}$, and very particularly $C_8F_{17}$.

For the purposes of the invention, either all or some of the fluorine radicals can interact with one another. "Some" of the fluorine radicals means here that about 1 to <100%, preferably 5 to 90% and particularly preferably 10 to 80%, of the fluorine radicals of M1 and M2 interact. In order to interact with one another, the separation of the fluorine atoms here can correspond, for example, approximately to the Van der Waals radius. At least the separation of the fluorine atoms from one another is such that an attractive F-F interaction occurs, comparable to the interaction in the case of hydrogen bonds.

The organic host compound can be a monomer, dimer, oligomer, dendrimer or polymer. In the case of the oligomer or polymer, either M1 or M2 is then, for example, bonded within the main chain of the oligomer or polymer in accordance with an advantageous embodiment of the invention. It can thus be ensured that two emitters or dyes M1 or two emitters or dyes M2 do not come so close that fluorescence quenching is caused.

The compositions and devices according to the invention may, for the purposes of the invention, comprise further materials. These are preferably organic functional materials. Organic-functional materials in the sense of the present invention are, in particular, organic conductors, organic semiconductors, organic dyes, organic fluorescent compounds, organic phosphorescent compounds, organic photoabsorbent compounds, organic photosensitisers, and other organic photoactive compounds. Organic functional materials in the sense of the invention can also be organic metal complexes, where the metal is selected from the group of the transition metals, the rare earths, lanthanoids and actinoids.

The said organic-functional materials can be selected from the group of the small molecules, the polymers, oligomers, dendrimers and blends.

Particularly preferred organic functional materials from the group of the small molecules are selected from the group of the hole-injection materials (HIMs), hole-transport materials (HTMs), hole-blocking materials (HBMs), electron-injection materials (EIMs), electron-transport materials (ETMs), electron-blocking materials (EBMs), exciton-blocking materials (ExBMs), host materials, emitter materials, metal complexes and dyes.

Organic functional materials in the sense of the invention are frequently described by the frontier orbitals HOMO (highest occupied molecular orbital; also called conduction band) and LUMO (lowest unoccupied molecular orbital; also called valence band) and by the band gap, i.e. the value of the energetic difference between HOMO and LUMO. The energies can be determined experimentally by means of CV (cyclic voltammetry), XPS (X-ray photoelectron spectroscopy) or UPS (ultraviolet photoelectron spectroscopy). The values can also be calculated by means of quantumchemical methods, for example by means of time-dependent density functional theory (DFT).

HIM in the sense of the invention is taken to mean a material which enables the injection of holes, i.e. positive charges, from an anode into an organic layer or into an anode. An HIM typically has an HOMO level which is comparable or higher than the electron work function of the anode, i.e. about −5.3 eV or higher.

The HIM used can be any material which is known to the person skilled in the art as HIM. Preferred HIMs in the sense of the inventions are selected from the group of the amines, triarylamines, thiophenes, carbazoles, phthalocyanines, porphyrins and derivatives thereof.

HTM in the sense of the invention is taken to mean a material which trans-ports the transport of holes, i.e. positive charges, which have been injected, for example, by an HIM or an anode. An HTM has an HOMO level which is typically greater than −5.4 eV. In many cases, the HTM also acts as HIM, which is also dependent on the adjacent layer. The HTM used can be any material which is known to the person skilled in the art as HTM. Preferred HTMs in the sense of the inventions are selected from the group of the amines, triarylamines, thiophenes, carbazoles, phthalocyanines, porphyrins and derivatives thereof.

HBM in the sense of the invention is taken to mean a material which is located in the direct vicinity of the emission layer and prevents the passage of holes. The HBM typically has a lower HOMO level compared with the HOMO level of the HTM in the adjacent layer. HBMs are frequently introduced between the emission layer and the electron-transport layer.

The HBM used can be any material which is known to the person skilled in the art as HBM. Preferred HBMs in the sense of the inventions are selected from the group of the metal complexes (US 2003/0068528), such as, for example, bis(2-methyl-8-quinolinolato)(4-phenylphenolato)aluminium(III) (BAlQ), fac-tris(1-phenylpyrazolato-N,$C_2$) iridium(III) (Ir(ppz)$_3$) (US 2003/0175553 A1). Phenanthroline derivatives can likewise be used for this purpose, such as, for example, BCP or phthalimides, such as, for example, TMPP. Further suitable HBMs are described in WO 00/70655 A2, WO 01/41512 and WO 01/93642 A1.

EIM in the sense of the invention is taken to mean a material which enables the injection of electrons from a cathode into an organic layer. An EIM typically has an LUMO level which is comparable or lower than the electron work function of the cathode, i.e. about −2.6 eV or lower.

The EIM used can be any material which is known to the person skilled in the art as EIM. Preferred EIMs in the sense of the inventions are selected from the group of the metal complexes of 8-hydroxyquinoline, heterocyclic organic compounds, fluorenones, fluorenylidene methanes, perylenetetracarboxylic acid, anthraquinone dimethanes, diphenoquinones, anthrones, anthraquinonediethylenediamines and derivatives thereof.

ETM in the sense of the invention is taken to mean a material which trans-ports the transport of electrons which are injected by an EIM or a cathode. An ETM has an LUMO level which is typically lower than −2.7 eV. In many cases, the ETM also acts as EIM, which is also dependent on the adjacent layer.

The ETM used can be any material which is known to the person skilled in the art as ETM. Preferred ETMs in the sense of the inventions are selected from the group of the imidazoles, pyridines, pyrimidines, pyridazines, pyrazines, oxadiazoles, quinolines, quinoxalines, anthracenes, benzanthracenes, pyrenes, perylenes, benzimidazoles, triazines, ketones, phosphine oxides, phenazines, phenanthrolines, triarylboranes and the derivatives thereof.

EBM in the sense of the invention is taken to mean a material which suppresses the transport of electrons and typically has a higher LUMO level than an ETM. The layer comprising an EBM is usually to be found directly on the emission layer and, if a layer comprising an ETM is present, between emission layer and the layer comprising an ETM.

The EBM used can be any material which is known to the person skilled in the art as EBM. Preferred EBMs in the sense of the inventions are selected from the group of the amines, triarylamines and transition-metal complexes, such as, for example, Ir(ppz)$_3$ (US 2003/0175553).

ExBM in the sense of the invention is taken to mean a material which prevents excitons from penetrating through the layer comprising ExBMs. A layer comprising ExBMs is usually found directly on the emission layer. ExBMs typically have a higher triplet level or singlet level than that of the emission layer or of the adjacent layer.

The ExBM used can be any material which is known to the person skilled in the art as ExBM. Preferred ExBMs in the sense of the inventions are selected from the group of the substituted triarylamines (US 2007/0134514 A1), such as, for example, MTDATA or 4,4',4''-tris(N,N-diphenylamino)triphenylamines (TDATA), N-substituted carbazoles, such as, for example, TCTA, heterocyclic compounds, such as BCP, and metal complexes, such as, for example, Ir(ppz)$_3$ or Alq$_3$.

Host materials in the sense of the invention are materials which are usually employed in combination with emitters and typically have greater band gaps between the HOMO and LUMO than the emitters.

Host materials furthermore behave either like electron-transport materials or like hole-transport materials. Other host materials exhibit both electron- and also hole-transport properties. Different host materials are used for fluorescent and phosphorescent emitters. In the case of fluorescent emitters, maximum overlap between the absorption spectrum of the emitter with the photoluminescence spectrum of the host material is desirable.

Host materials are frequently also called matrix material or matrix for short, in particular if the host material is used in combination with a phosphorescent emitter. In the case of a copolymer which comprises emitters, the polymeric backbone functions as host material.

The host material used can be any material which is known to the person skilled in the art as host material. Preferred host materials in the sense of the inventions are described in detail above.

Suitable host compounds in the sense of the invention are preferably selected from the group consisting of anthracene, binaphthylanthracene, phenanthrene, indenofluorene, fluorene, pyrene, amine, thiophene, imidazole, phenylene, biphenylene, naphthalene, dihydrophenanthrene, spirobifluorene, phenylene-vinylene, carabazole, pyrene, perylene, 9,10-dihydrophenanthrene, condensed thiophenes, such as, for example, thieno[2,3b]thiophene or thieno[3,2b]thiophene, dithienothiophene, dibenzothiophene, phenanthroline, trans-indenofluorene, cis-indenofluorene, dibenzoindenofluorene, indenonaphthalene, triarylamine, binaphthyl, benzenefluorene, benzanthrene, molecular units containing ketone groups, or derivatives and mixtures thereof.

Suitable host materials for fluorescent dopants for this purpose are materials from various classes of substance. Preferred host materials are selected from the classes of the oligoarylenes (for example 2,2',7,7'-tetra-phenylspirobifluorene in accordance with EP 676461 or dinaphthylanthracene), in particular the oligoarylenes containing condensed aromatic groups, such as, for example, anthracene, benzanthracene, benzophenanthrene (DE 102009005746.3, WO 09/069,566), phenanthrene, tetracene, corones, chrysene, fluorene, spirofluorene, perylene, phthaloperylene, naphthaloperylene, decacyclene, rubrene, the oligoarylenevinylenes (for example DPVBi=4,4'-bis(2,2-diphenylethenyl)-1,1'-biphenyl) or spiro-DPVBi in accordance with EP 676461), the polypodal metal complexes (for example in accordance with WO 2004/081017), in particular metal complexes of 8-hydroxyquinoline, for example AlQ$_3$ (=aluminium(III) tris(8-hydroxyquinoline)) or bis(2-methyl-8-quinolinolato)-4-(phenylphenolinolato)aluminium, also with imidazole chelate (US 2007/0092753 A1) and the quinoline-metal complexes, aminoquinoline-metal complexes, benzoquinoline-metal complexes, the hole-transporting compounds (for example in accordance with WO 2004/058911), the electron-transporting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (for example in accordance with WO 2008/145239).

Particularly preferred host materials are selected from the classes of the oligoarylenes, comprising anthracene, benzanthracene and/or pyrene or atropisomers of these compounds. An oligoarylene in the sense of this invention is intended to be taken to mean a compound in which at least three aryl or arylene groups are bonded to one another.

Preferred host materials are selected, in particular, from compounds of the formula (1),

where $Ar^4$, $Ar^5$, $Ar^6$ is on each occurrence, identically or differently, an aryl or heteroaryl group having 5 to 30 aromatic ring atoms, which may be substituted by one or more radicals, p is 1, 2 or 3, and the sum of the π electrons in $Ar^4$, $Ar^5$ and $Ar^6$ should be at least 30 if p =1 and at least 36 if p=2 and at least 42 if p=3.

In the host materials of the formula (1), the group $Ar^5$ particularly preferably stands for anthracene, which may be substituted by one or more radicals $R^1$, and the groups $Ar^4$ and $Ar^6$ are bonded in the 9- and 10-position. At least one of the groups $Ar^4$ and/or $Ar^6$ is very particularly preferably a condensed aryl group selected from 1- or 2-naphthyl, 2-, 3- or 9-phenanthrenyl or 2-, 3-, 4-, 5-, 6- or 7-benzanthracenyl, each of which may be substituted by one or more radicals $R^1$. Anthracene-based compounds are described in US 2007/0092753 A1 and US 2007/0252517 A1, for example 2-(4-methylphenyl)-9,10-di(2-naphthyl)anthracene, 9-(2-naphthyl)-10-(1,1'-biphenyl)anthracene and 9,10-bis[4-(2,2-diphenylethenyl)phenyl]anthracene, 9,10-diphenylanthracene, 9,10-bis(phenylethynyl)anthracene and 1,4-bis(9'-ethynylanthracenyl)benzene. Preference is also given to compounds having two anthracene units (US 2008/0193796 A1), for example 10,10'-bis[1,1',4',1'']terphenyl-2-yl-9,9'-bisanthracenyl.

Further preferred compounds are derivatives of arylamine, styrylamine, fluorescein, diphenylbutadiene, tetraphenylbutadiene, cyclopentadienes, tetraphenylcyclopentadiene, pentaphenylcyclopentadiene, coumarin, oxadiazole, bisbenzoxazoline, oxazole, pyridine, pyrazine, imine, benzothiazole, benzoxazole, benzimidazole (US 2007/0092753 A1), for example 2,2',2''-(1,3,5-phenylene)tris[1-phenyl-1H-benzimidazole], aldazine, stilbene, styrylarylene derivatives, for example 9,10-bis[4-(2,2-diphenylethenyl)phenyl]anthracene and distyrylarylene derivatives (U.S. Pat. No. 5,121,029), diphenylethylene, vinylanthracene, diaminocarbazole, pyran, thiopyran, diketopyrrolopyrrole, polymethine, cinnamic acid esters and fluorescent dyes.

Particular preference is given to derivatives of arylamine and styrylamine, for example TNB (=4,4'-bis[N-(1-naphthyl)-N-(2-naphthyl)amino]biphenyl). Metal-oxinoid complexes, such as Liq or Alq$_3$, can be used as co-hosts.

Preferred compound with oligoarylene as matrix have been published in US 2003/0027016 A1, U.S. Pat. No. 7,326,371B2, US 2006/043858 A, U.S. Pat. No. 7,326,371 B2, US 2003/0027016 A1, WO 2007/114358, WO 2008/145239, JP 3148176 B2, EP 1009044, US 2004/018383, WO 2005/061656 A1, EP 0681019B1, WO 2004/013073A1, U.S. Pat. No. 5,077,142, WO 2007/065678, and US 2007/0205412 A1. Particularly preferred compounds thereof are those of the formulae 2 to 8.
formula 2
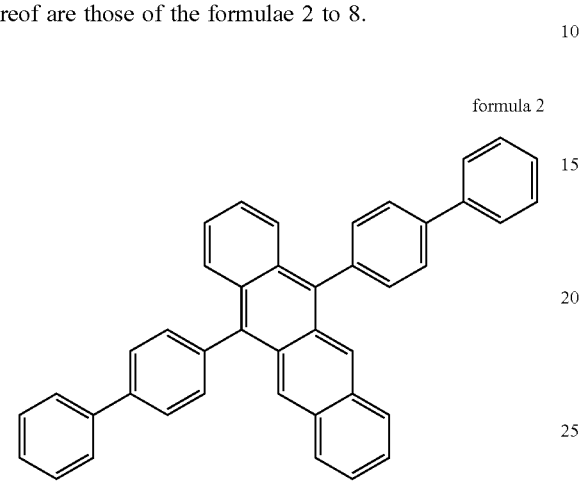
formula 3
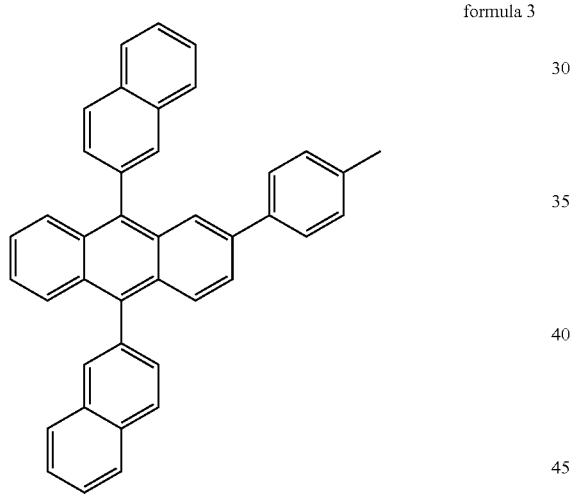
formula 4
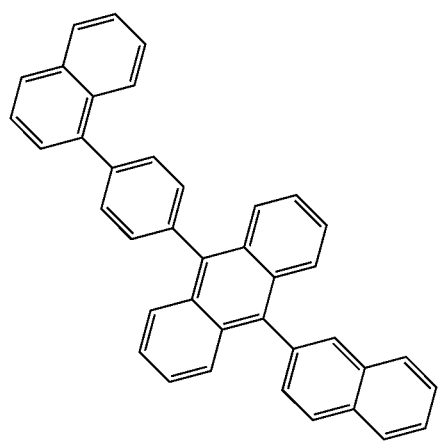
formula 5
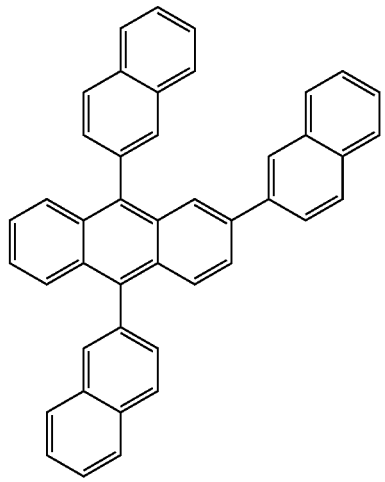
formula 6
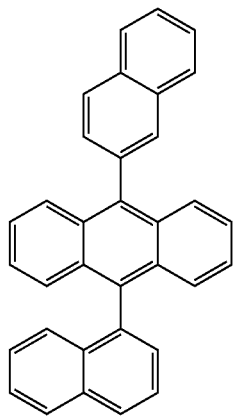
formula 7
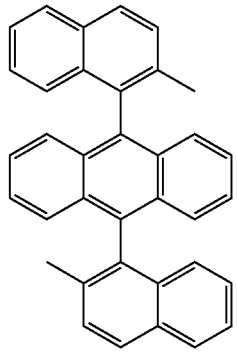

-continued

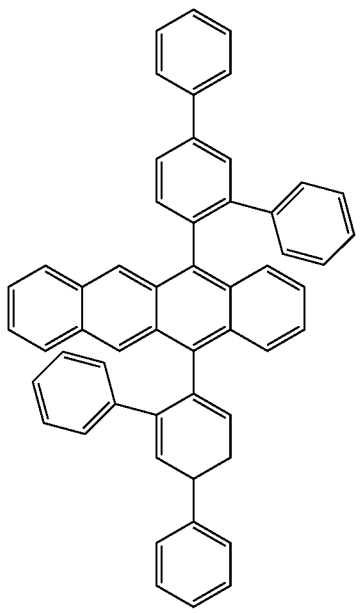

formula 8

Further preferred host materials for fluorescent emitters are spirobifluorenes and derivatives thereof, such as, for example, spiro-DPVBi, as published in EP 0676461, and indenofluorenes, as published in U.S. Pat. No. 6,562,485.

Preferred matrix materials for phosphorescent emitters are CBP (N,N-bis-carbazolylbiphenyl), carbazole derivatives (for example in accordance with WO 2005/039246, US 2005/0069729, JP 2004/288381, EP 1205527 or WO 2008/086851), azacarbazoles (for example in accordance with EP 1617710, EP 1617711, EP 1731584, JP 2005/347160), ketones (for example in accordance with WO 04/093207 or in accordance with DE 102008033943.1), phosphine oxides, sulfoxides and sulfones (for example in accordance with WO 2005/003253), oligophenylenes, aromatic amines (for example in accordance with US 2005/0069729), bipolar matrix materials (for example in accordance with WO 2007/137725), silanes (for example in accordance with WO 2005/111172), 9,9-diarylfluorene derivatives (for example in accordance with DE 102008017591), azaboroles or boronic esters (for example in accordance with WO 2006/117052), triazine derivatives (for example in accordance with DE 102008036982), indolocarbazole derivatives (for example in accordance with WO 2007/063754 or WO 2008/056746), indenocarbazole derivatives (for example in accordance with DE 102009023155.2 and DE 102009031021.5), diazaphosphole derivatives (for example in accordance with the unpublished application DE 102009022858.6), triazole derivatives, oxazoles and oxazole derivatives, imidazole derivatives, polyarylalkane derivatives, pyrazoline derivatives, pyrazolone derivatives, distyrylpyrazine derivatives, thiopyran dioxide derivatives, phenylenediamine derivatives, tertiary aromatic amines, styrylamines, amino-substituted chalcone derivatives, indoles, hydrazone derivatives, stilbene derivatives, silazane derivatives, aromatic dimethylidene compounds, carbodiimide derivatives, metal complexes of 8-hydroxyquinoline derivatives, such as, for example, AlQ$_3$, the 8-hydroxyquinoline complexes may also contain triarylaminophenol ligands (US 2007/0134514 A1), metal complex-polysilane compounds, and thiophene, benzothiophene and dibenzothiophene derivatives.

The materials can be used as pure materials or doped, such as, for example, CBP intrinsic or doped with BczVBi (=4,4'-(bis(9-ethyl-3-carbazovinylene)-1,1'-biphenyl).

It is furthermore preferred to use mixtures of two or more of the above-mentioned matrix materials, in particular mixtures of an electron-transporting material and a hole-transporting material.

Particularly preferred matrix materials for phosphorescent emitters are selected from the group of the indolocarbazoles and derivatives thereof (for example compounds of the formulae 9 to 16), as disclosed, for example, in DE 102009023155.2, EP 0906947, EP 0908787, EP 906948, WO 2008/056746A1, WO 2007/063754A1, WO 2008/146839A1, and WO 2008/149691A1.

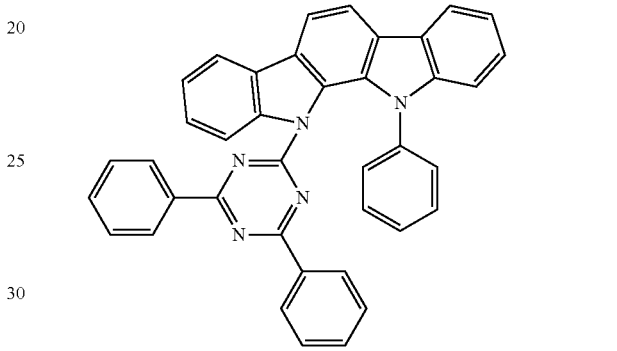

formula 9

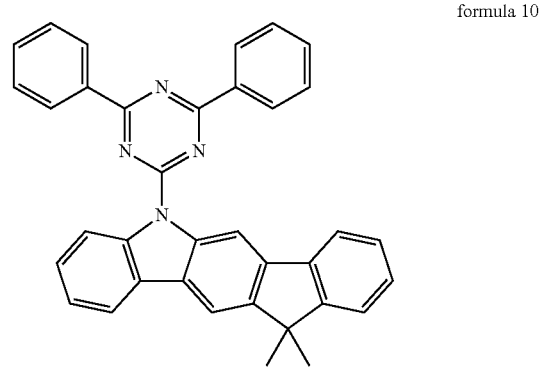

formula 10

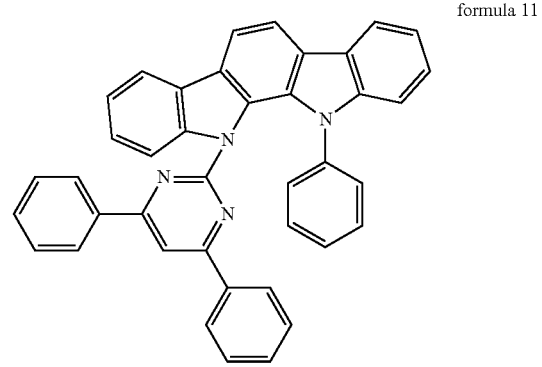

formula 11 formula 12

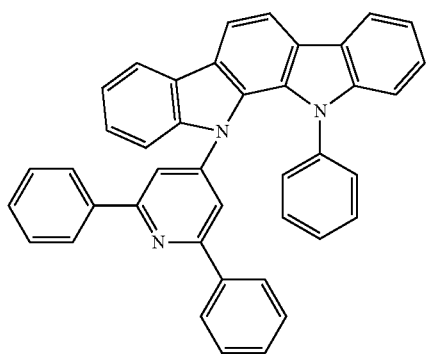

formula 13

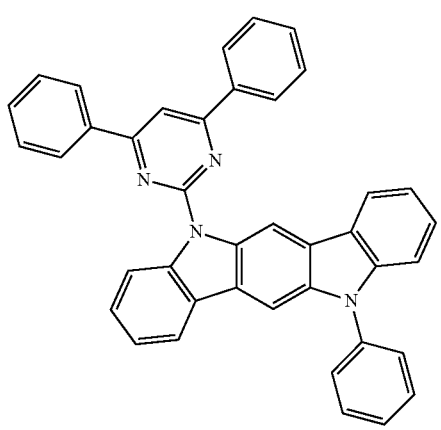

formula 14

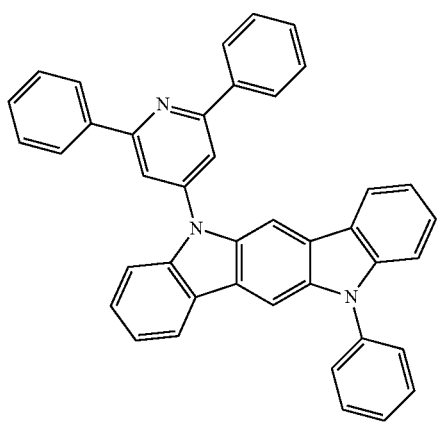

formula 15

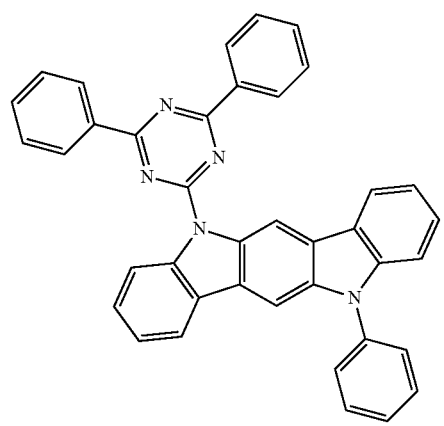

formula 16

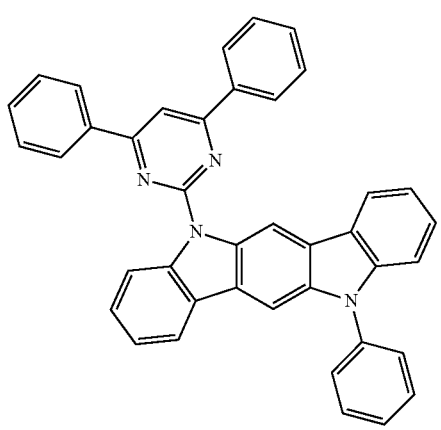

Examples of preferred carbazole derivatives are mCP (=1,3-N,N-dicarbazole-benzene (=9,9'-(1,3-phenylene)bis-9H-carbazole)), CDBP (=9,9'-(2,2'-dimethyl[1,1'-biphenyl]-4,4'-diyl)bis-9H-carbazole), 1,3-bis(N,N'-dicarbazole)benzene (=1,3-bis(carbazol-9-yl)benzene), PVK (polyvinylcarbazole), 3,5-di(9H-carbazol-9-yl)biphenyl and the compounds depicted below.

Examples of preferred carbazole derivatives are 1,3-N,N-dicarbazole-benzene (=9,9'-(1,3-phenylene)bis-9H-carbazole) (mCP), 9,9'-(2,2'-dimethyl[1,1'-biphenyl]-4,4'-diyl)bis-9H-carbazole (CDBP), 1,3-bis(N,N'-dicarbazole)benzene (=1,3-bis(carbazol-9-yl)benzene), PVK (polyvinylcarbazole), 3,5-di(9H-carbazol-9-yl)biphenyl (see compounds of the formulae 17 to 21).

formula 17

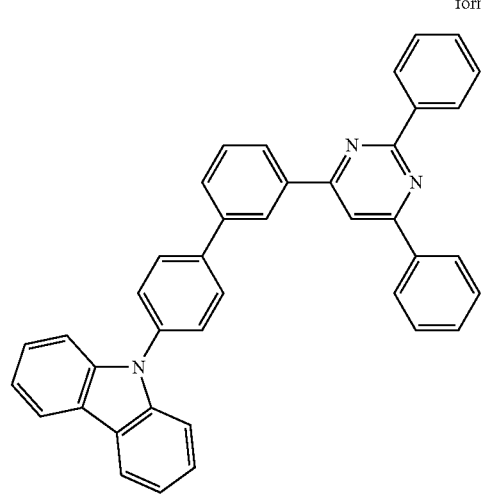

formula 18
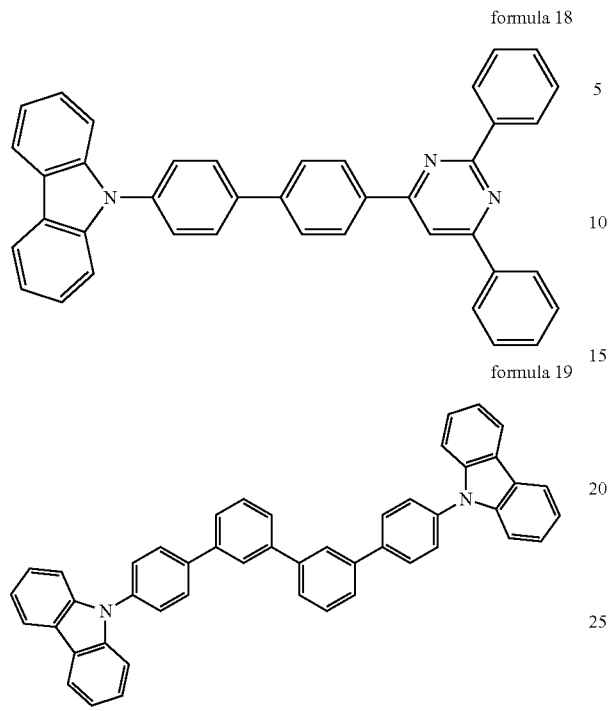
formula 19
formula 20
formula 21
formula 22
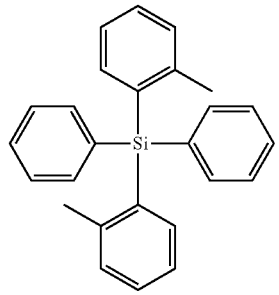
formula 23
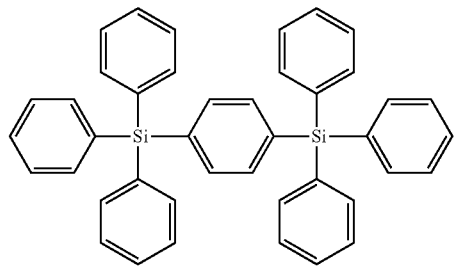
formula 24
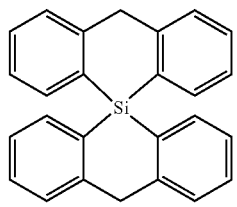
formula 25
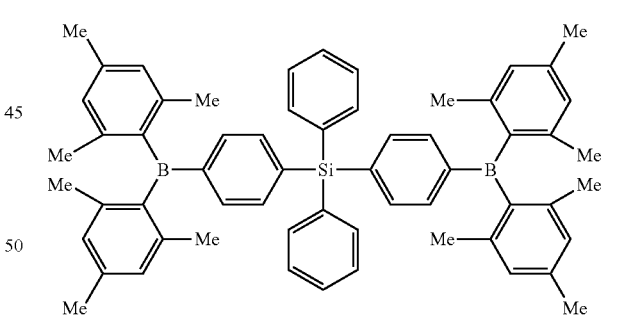
formula 26
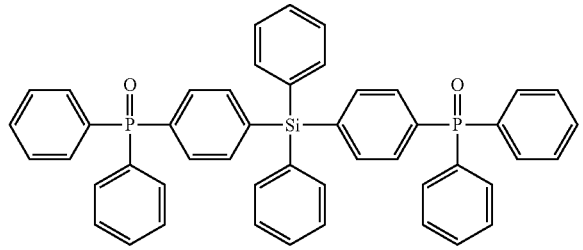
Preferred Si-tetraaryl compounds are, for example, (US 2004/0209115, US 2004/0209116) (US 2004/0209115, US 2004/0209116, US 2007/0087219 A1, US 2007/0087219 A1), the compounds of the formulae 22 to 29.

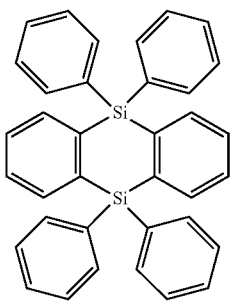

formula 27

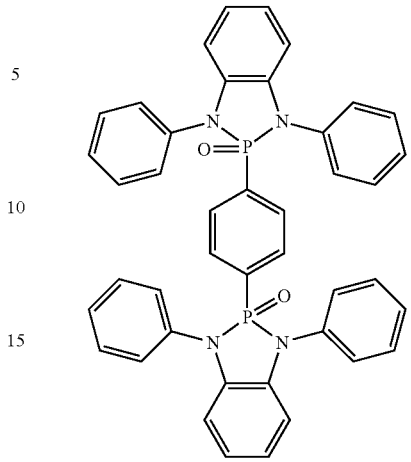

formula 30

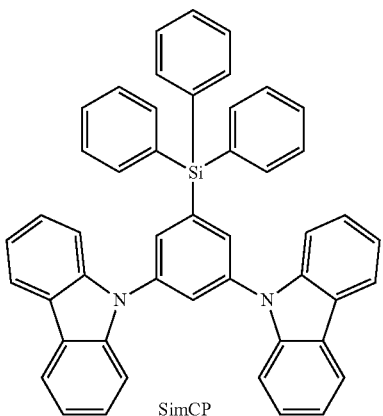

SimCP formula 28

A further preferred matrix material is the compound of the formula 31 (EP 652273 B1)

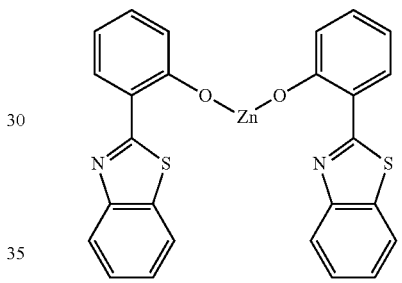

formula 31

A further preferred matrix material is selected from the group of compounds of the formula 32 (EP 1923448B1).

[M(L)$_2$]$_n$  formula 32

Where M and L are as defined in the reference indicated. It is particularly preferred for the metal M to be equal to Zn and for the ligand L to be equal to 8-hydroxyquinolinate and n to be equal to 2, 3 or 4. Particular preference is given to [Znq$_2$]$_2$, [Znq$_2$]$_3$, and [Znq$_2$]$_4$.

Emitters in the sense of the invention are materials which, caused by the uptake of excitonic energy from other materials by any type of energy transfer or by the formation of excitons by electronic or optical processes, emit light. As already mentioned, the emitters are divided into two groups, the fluorescent emitters and the phosphorescent emitters. The term dopant in the sense of the present invention is taken to mean an emitter.

The emitter used can be any material which is known to the person skilled in the art as emitter. Preferred emitters in the sense of the inventions are described elsewhere within the present invention. Further preferred emitters in the sense of the present invention are described elsewhere in the present invention.

Preferred fluorescent dopants are selected from the class of the monostyrylamines, the distyrylamines, the tristyrylamines, the tetrastyrylamines, the styrylphosphines, the styryl ethers and the arylamines.

A monostyrylamine is taken to mean a compound which contains one substituted or unsubstituted styryl group and at least one, preferably aromatic, amine. A distyrylamine is

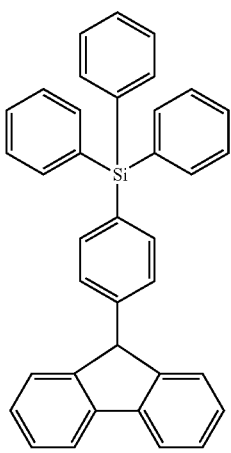

formula 29

A further preferred matrix material in the sense of the invention is the compound of the formula 30 (DE 102009022858.6).

taken to mean a compound which contains two substituted or unsubstituted styryl groups and at least one, preferably aromatic, amine. A tristyrylamine is taken to mean a compound which contains three substituted or unsubstituted styryl groups and at least one, preferably aromatic, amine. A tetrastyrylamine is taken to mean a compound which contains four substituted or unsubstituted styryl groups and at least one, preferably aromatic, amine. The styryl groups are particularly preferably stilbenes, which may also be further substituted. Corresponding phosphines and ethers are defined analogously to the amines. An arylamine or an aromatic amine in the sense of the present invention is taken to mean a compound which contains three substituted or unsubstituted aromatic or heteroaromatic ring systems bonded directly to the nitrogen. At least one of these aromatic or heteroaromatic ring systems is preferably a condensed ring system, preferably having at least 14 aromatic ring atoms. Preferred examples thereof are aromatic anthracenamines, aromatic anthracenediamines, aromatic pyrenamines, aromatic pyrenediamines, aromatic chrysenamines or aromatic chrysenediamines. An aromatic anthracenamine is taken to mean a compound in which one diarylamino group is bonded directly to an anthracene group, preferably in the 9-position. An aromatic anthracenediamine is taken to mean a compound in which two diarylamino groups are bonded directly to an anthracene group, preferably in the 2,6- or 9,10-position. Aromatic pyrenamines, pyrenediamines, chrysenamines and chrysenediamines are defined analogously thereto, where the diarylamino groups are preferably bonded to the pyrene in the 1-position or in the 1,6-position.

Examples of phosphorescent emitters are revealed by the applications WO 00/70655, WO 01/41512, WO 02/02714, WO 02/15645, EP 1191613, EP 1191612, EP 1191614 and WO 2005/033244. In general, all phosphorescent complexes, as used in accordance with the prior art for phosphorescent OLEDs and as are known to the person skilled in the art in the area of organic electroluminescence, are suitable, and the person skilled in the art will be able to use further phosphorescent complexes without inventive step.

Phosphorescent metal complexes preferably contain Ir, Ru, Pd, Pt, Os or Re.

Dyes in the sense of the invention is taken to mean a material which absorbs light and thereby appears coloured. The dyes in the sense of the invention pass the energy taken up in this way to other materials in any form (for example as light or in the form of another converted energy). Dyes in the sense of the invention are, in particular, all compounds which are able to absorb light and generate free charge carriers, with or without the action of an external electric field.

The dye used can be any material which is known to the person skilled in the art as dye in the sense of the invention. Preferred dyes are those which are described elsewhere in the present invention. For the purposes of the invention, particular preference is given to dyes from the group of organic compounds having condensed ring systems. Very particular preference is given here to dyes selected from the group of the anthracenes, naphthalenes, pentacenes, tetracenes and derivatives thereof.

In the case of the oligomers or polymers, these groups can be linear, branched or dendritic. In general, a polymeric host material consists of at least one polymer backbone recurring unit and at least one recurring unit containing a host or matrix material which is described elsewhere in the present invention.

Preferred polymer backbone recurring units contain aromatic or heteroaromatic units having 6 to 40 C atoms. Examples thereof are derivatives of 4,5-dihydropyrene, derivatives of 4,5,9,10-tetrahydropyrene, derivatives of fluorene, as disclosed, for example, in U.S. Pat. No. 5,962,631, WO 2006/052457 A2 and WO 2006/118345A1, derivatives of 9,9'-spirobifluorene (for example WO 2003/020790 A1), derivatives of 9,10-phenanthrene (for example WO 2005/104264 A1), derivatives of 9,10-dihydrophenanthrene (for example WO 2005/014689 A2), derivatives of 5,7-dihydrodibenzooxepine and derivatives of cis- and trans-indenofluorenes (for example WO 2004041901A1, WO 2004113412 A2) and derivatives of binaphthylene (for example WO 2006/063852 A1) and further recurring units, as described, for example, in WO 2005/056633A1, EP 1344788A1, WO 2007/043495A1, WO 2005/033174 A1, WO 2003/099901A1 and DE 102006003710.3.

Further preferred compounds which are suitable as polymer backbone recurring unit can be selected from the group consisting of fluorene derivatives (for example U.S. Pat. No. 5,962,631, WO 2006/052457 A2 and WO 2006/118345 A1), spirobifluorene derivatives (for example WO 2003/020790 A1), benzofluorenes, dibenzofluorenes, benzothiophenes, dibenzofluorenes and derivatives thereof (for example WO 2005/056633A1, EP 1344788A1 and WO 2007/043495A1).

Particularly preferred polymer backbone recurring units are compounds of the formula 33.

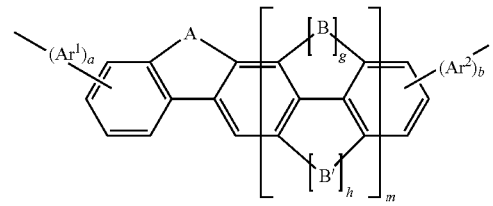

formula 33 where

A, B and B', independently of one another and, if occurring multiple times, likewise independently of one another, are a divalent group, preferably selected from —CR$^1$R$^2$—, —NR$^1$—, —PR$^1$—, —O—, —S—, —SO—, —SO$_2$—, —CO—, —CS—, —CSe—, —P(=O)R$^1$—, —P(=S)R$^1$— and —SiR$^1$R$^2$—, R$^1$ and R$^2$ are, independently of one another, identical or different groups, which can be selected from the group consisting of H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl group or carbyl or hydrocarbyl having 1 to 40 C atoms, which are optionally substituted and optionally contain one or more heteroatoms, and the groups R$^1$ and R$^2$ may optionally form a spiro group with the fluorene unit to which they are bonded, X is a halogen, R$^0$ and R$^{00}$ are, independently of one another, H or purely optionally substituted carbyl or hydrocarbyl radical, which optionally contains one or more heteroatoms, each g can be, independently of the other, 0 or 1, and each corresponding h in the same sub-unit is then the respective other of 0 and 1, m is an integer which is greater than or equal to 1, Ar[1] and Ar[2] are, independently of one another, mono- or polynuclear aryl or heteroaryl groups, which are optionally substituted or optionally condensed at the 7,8-positions or 8,9-positions of the indenofluorene group, a and b are, independently of one another, 0 or 1.

If the groups R[1] and R[2] form a spiro group with the fluorene unit to which they are bonded, they then preferably form a spirobifluorene.

A further preferred subject-matter of the present invention is the polycondensation host material a non-conjugated or only partially conjugated polymer.

A particularly preferred non- or only partially conjugated polymer in the sense of the invention contains a non-conjugated recurring unit.

A very particularly preferred non-conjugated recurring unit can be selected from the group of the indenofluorenes and derivatives thereof (for example DE 102009023156.0)

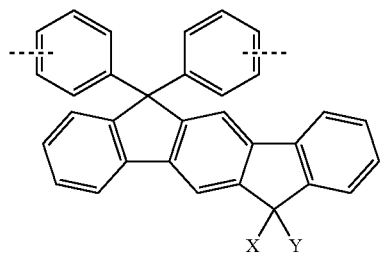

formula 34

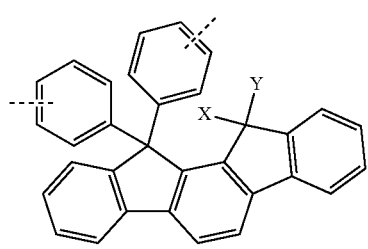

formula 35 where X and Y are selected, independently of one another, from the group which consists of H, F, a $C_{1-40}$-alkyl group, a $C_{2-40}$-alkenyl group, a $C_{2-40}$-alkynyl group, an optionally substituted $C_{6-40}$-aryl group and an optionally substituted 5- to 25-membered heteroaryl group;

Further preferred non-conjugated backbone recurring units are fluorenes, phenanthrenes, dehydrophenanthrenes, indenofluorenes and derivatives thereof (for example DE 102009023154.4).

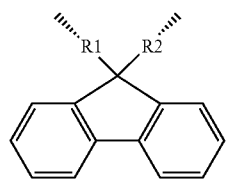

formula 36

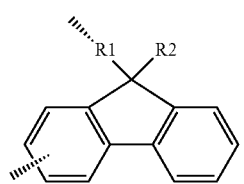

formula 37

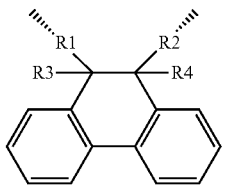

formula 38

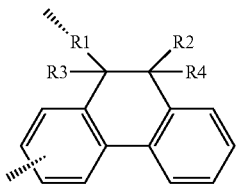

formula 39

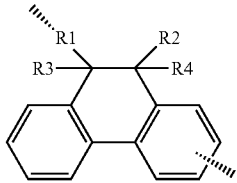

formula 40

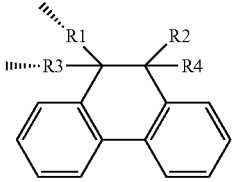

formula 41

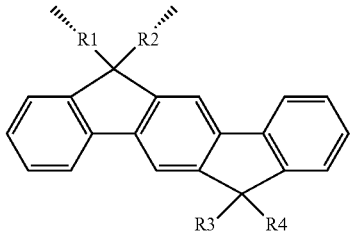

formula 42

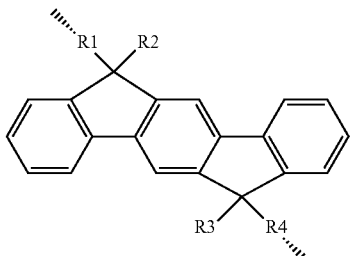

formula 43

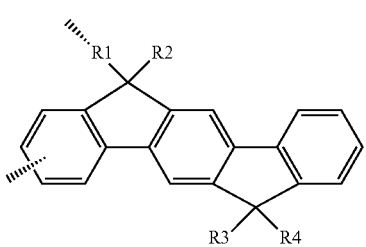

formula 44

-continued

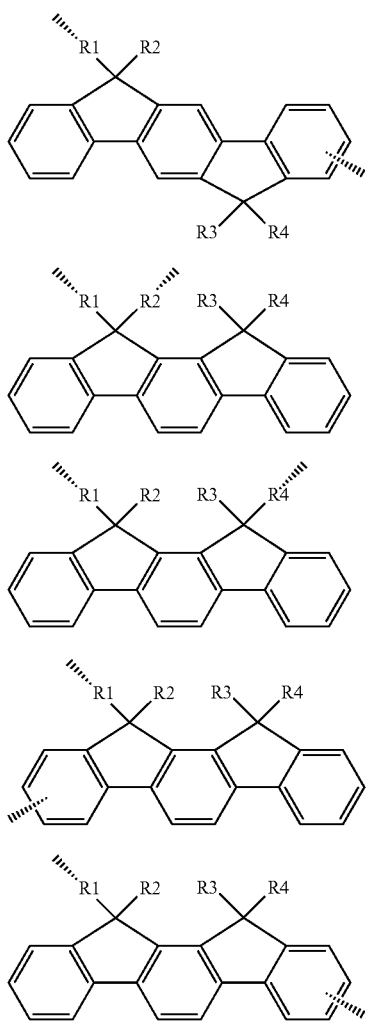

where R1 to R4 have the same meaning as the radicals X and Y defined above.

In a further preferred embodiment of the present invention, the polymeric host material is a non-conjugated polymer which contains at least one host group as described above and at least one charge-transport group in the side chain of the polymer. Examples of non-conjugated polymers which contain functional groups in the side chain and the synthesis thereof are described, for example, in U.S. Pat. No. 7,250,226 B2, JP 2007/211243 A2, JP 2007/197574 A2, U.S. Pat. No. 7,250,226 B2, JP 2007/059939A.

Examples of non-conjugated polymers as host for singlet emitters which optionally contain further charge-transport groups in the side chain and the synthesis thereof are described, for example, in JP 2005/108556, JP 2005/285661 and JP 2003/338375.

Furthermore, the host compound may contain further structural units, selected from the following groups 1 to 4. These are, inter alia, those as disclosed and extensively listed in WO 02/077060 A1 and in WO 2005/014689 A2. These are considered to be part of the present invention by way of reference. The further structural elements can originate, for example, from the following classes:

group 1: units which enhance the hole-injection and/or hole-transport properties of the polymers;

group 2: units which enhance the electron-injection and/or electron-transport properties of the polymers;

group 3: units which influence the film-morphological and/or rheological properties of the resultant polymers.

group 4: units which are typically used as backbone;

Preferred host compounds according to the invention are those in which at least one structural unit has charge-transport properties, i.e. which comprise units from group 1 and/or 2.

Structural units from group 1 which have hole-injection and/or hole-trans-port properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high-lying HOMO. These arylamines and heterocycles preferably result in an HOMO in the host compound of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low-lying LUMO. These units in the polymer preferably result in an LUMO in the host compound of less than −1.5 eV (against vacuum level), particularly preferably less than −2.0 eV.

It may be preferred for the host compounds according to the invention to comprise units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 3 are those which influence the film-morphological and/or rheological properties of the host compounds, such as, for example, siloxanes, long alkyl chains or fluorinated groups, but also particularly rigid or flexible units, such as, for example, liquid crystal-forming units or crosslinkable groups.

Structural units from group 4 are units which contain aromatic structures having 6 to 40 C atoms which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzooxepine derivatives and cis- and trans-indenofluorene derivatives.

Preference is given to host compounds according to the invention which contain one or more units selected from groups 1 to 4 which are different from the preferred structural units. It may likewise be preferred for more than one structural unit from a group to be present simultaneously.

Preference is given here to host compounds according to the invention which contain units from group 4, particularly preferably at least 50 mol % of these units, based on the total number of structural units in the host compound.

It is likewise preferred for the host compounds according to the invention to contain units which improve the charge transport or charge injection, i.e. units from group 1 and/or 2; particular preference is given to a content of 0.5 to 30 mol % of these units; very particular preference is given to a content of 1 to 10 mol % of these units.

It is furthermore particularly preferred for the host compounds according to the invention to contain structural units from group 4 and units from group 1 and/or 2, in particular at least 50 mol % of units from group 4 and 0.5 to 30 mol % of units from group 1 and/or 2.

If the host compounds according to the invention are oligomers or polymers, these are either homopolymers comprising the above-mentioned structural units or copolymers. The oligomers or polymers according to the invention may be linear, branched or crosslinked.

In order to be able to polymerise the above-mentioned structural units, these preferably have leaving groups which are accessible to a coupling reaction, preferably a metal-catalysed cross-coupling reaction. The compounds functionalised with the leaving groups represent the basis for a polymerisation. Thus, bromine derivatives can be reacted with arylboronic acids or arylboronic acid derivatives by a Suzuki coupling or with organotin compounds by a Stille reaction to give the corresponding oligomers, polymers or dendrimers.

These processes are known from the prior art. Thus, the Suzuki coupling is, for example, a cross-coupling reaction for the formation of diphenyl derivatives or vinylaromatic compounds, where arylboronic acids are preferably reacted with haloaromatic compounds with catalytic use of, preferably, palladium-phosphine complexes. The reactivity of the aromatic compounds increases from bromine via trifluoromethanesulfonic acid ester to iodine, where in the meantime even weakly reactive chloroaromatic compounds can be reacted with palladium-phosphine catalysts. The Stille cross-coupling reaction proceeds analogously, with organoboron compounds being replaced by organotin compounds, which, however, are not very preferred owing to their high toxicity.

For the purposes of the invention, particular preference is given to structural units which are substituted by reactive leaving groups, such as bromine, iodine, boronic acid, boronic acid ester, tosylate or triflate. These can also be used as comonomers for the production of corresponding conjugated, partially conjugated or non-conjugated polymers, oligomers or also as the core of dendrimers. The polymerisation here preferably takes place via the halogen functionality or the boronic acid functionality.

The composition according to the invention preferably comprises between 99 and 1% by weight, more preferably between 98 and 10% by weight, even more preferably between 97 and 60% by weight, in particular between 97 and 85% by weight, of the host compound. The molar ratio of the emitter or absorber compounds M1:M2 here is 0.1:1 to 1:0.1, in the case where complete energy transfer from M1 to M2 is desired, preferably 1:2 to 2:1, particularly preferably 1:1; and in the case where only partial energy transfer fr4om M1 to M2 is desired, such as, for example, for broad emission, in particular white, preferably 1:0.1 to 1:0.3, particularly preferably 1:0.1 to 1:0.2. In the case of complete energy transfer, the composition correspondingly comprises between 1 and 99% by weight, preferably between 2 and 90% by weight, particularly preferably between 3 and 40% by weight, in particular between 5 and 15% by weight, of the emitter compounds M1 and M2, in each case based on the entire mixture of emitter compounds and host compound.

The invention furthermore relates to a process for the preparation of a composition as described above, comprising the steps:

a) preparation of a solution comprising an emitter compound M1 and an emitter compound M2 in a solvent L1,
b) preparation of a solution comprising the organic host compound in a solvent L2,
c) mixing of the two solutions.

It is furthermore preferred for the solvent L1 and L2 to be identical or for both to be at least miscible with one another. Due to the mixing of the two solutions, the two compounds M1 and M2 come so close with their fluorine radicals that a fluorine-fluorine interaction occurs. Effective Förster energy transfer can thus be ensured.

The present invention furthermore relates to the use of the above-mentioned compositions and/or associates in an organic electronic device. Particular preference is given here to organic opto-electronic devices.

The invention furthermore relates to the use of the above-mentioned composition in an organic electroluminescent device. The composition according to the invention is preferably in the form of an electroluminescent layer here. A layer is formed in accordance with the invention through removal of the solvents. The reduced mobility of the emitters M1 and M2, which are adhered through F-F interaction, significantly enhances the film-formation property of the composition.

The invention furthermore relates to an organic electroluminescent device, preferably comprising a cathode, an anode and at least one organic layer, where the organic layer comprises the composition according to the invention. As just stated, the organic layer which comprises the composition according to the invention is preferably the emitting layer. In addition, the organic electroluminescent device may comprise further layers selected from in each case one or more hole-injection layers, hole-transport layers, hole-blocking layers, electron-transport layers, electron-injection layers, electron-blocking layers, charge-generation layers and/or layers which generate organic or inorganic P/N junctions. The electroluminescent device may in addition comprise further emitting layers. So-called interlayers, which have, for example, an exciton-blocking function, are preferably introduced between two emitting layers. However, it should be pointed out that each of these layers does not necessarily have to be present.

If the organic electroluminescent device comprises a plurality of emitting layers, where at least one emitting layer comprises the composition according to the invention, these plurality of layers preferably have in total a plurality of emission maxima between 380 nm and 750 nm, resulting overall in white emission, i.e. various emitting compounds which are able to fluoresce or phosphoresce are used in the emitting layers. Particular preference is given to three layer systems, where the three layers exhibit blue, green and orange or red emission, for the basic structure see, for example, WO 05/011013.

The various layers can be applied differently for the purposes of the invention. For example, one or more layers in the electroluminescent device according to the invention can be applied from solution and one or more layers can be applied via a sublimation process, in which the materials are applied by vapour deposition in vacuum sublimation units at a pressure $<10^{-5}$ mbar, preferably $<10^{-6}$ mbar, particularly preferably $<10^{-7}$ mbar. It is likewise possible to apply one or more layers by means of OVPD (organic vapour phase deposition) processes or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and are thus structured (for example M. S. Arnold et al., Appl. Phys. Lett. 2008, 92, 053301).

However, it is particularly preferred for one or more layers in the organic electroluminescent device to be applied from solution, for example by spin coating or by means of any desired printing process, such as, for example, screen printing, flexographic printing or offset printing. But particularly preferably LITI (light induced thermal imaging, thermal transfer printing), or ink-jet printing. These processes are generally known to the person skilled in the art and can be applied by him without problems to organic electroluminescent devices.

The devices according to the invention exhibit a particular internal structure in the layer in which the intermolecular associates and/or the compositions comprising the associates can be found. The electronic, preferably optoelectronic and particularly preferably electroluminescent devices, which differ from the known devices, can therefore be produced by means of the associates and/or compositions according to the invention.

The present invention therefore furthermore relates to electronic, preferably opto-electronic and particularly preferably electroluminescent devices which are obtainable by the use of the associates according to the invention and/or the compositions according to the invention.

The device usually comprises a cathode and an anode (electrodes). The electrodes (cathode, anode) are selected for the purposes of this invention in such a way that their potential corresponds as well as possible to the potential of the adjacent organic layer in order to ensure the most efficient electron or hole injection possible.

The cathode preferably comprises metal complexes, metals having a low work function, metal alloys or multilayered structures comprising various metals, such as, for example, alkaline-earth metals, alkali metals, maingroup metals or lanthanoids (for example Ca, Ba, Mg, Al, In, Mg, Yb, Sm, etc.). In the case of multilayered structures, further metals which have a relatively high work function, such as, for example, Ag, may also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides (for example LiF, $Li_2O$, $BaF_2$, MgO, NaF, etc.). The layer thickness of this layer is preferably between 1 and 10 nm, more preferably 2-8 nm.

The anode preferably comprises materials having a high work function. The anode preferably has a potential of greater than 4.5 eV vs. vacuum. Suitable for this purpose are on the one hand metals having a high redox potential, such as, for example, Ag, Pt or Au. On the other hand, metal/metal oxide electrodes (for example $Al/Ni/NiO_x$, $Al/PtO_x$) may also be preferred. For some applications, at least one of the electrodes must be transparent in order to enable either irradiation of the organic material (O—SCs) or the coupling-out of light (OLEDs/PLEDs, O-lasers). A preferred structure uses a transparent anode. Preferred anode materials here are conductive mixed metal oxides. Particular preference is given to indium tin oxide (ITO) or indium zinc oxide (IZO). Preference is furthermore given to conductive doped organic materials, in particular conductive doped polymers.

The device is correspondingly structured in a manner known per se, depending on the application, provided with contacts and finally hermetically sealed, since the lifetime of devices of this type is drastically shortened in the presence of water and/or air.

The 3 electroluminescent device according to the invention is preferably selected from the group consisting of organic electroluminescent devices (OLEDs), organic field-effect transistors (O-FETs), organic thin-film transistors (O-TFTs), organic light-emitting transistors (O-LETs), organic integrated circuits (O-ICs), organic solar cells (O-SCs), dye-sensitised organic solar cells (DSSCs), organic optical detectors, organic photoreceptors, organic field-quench devices (O-FQDs), organic light-emitting electrochemical cells (LECs), organic laser diodes (O-lasers) and organic plasmon emitting devices. Particular preference is given to organic electroluminescent devices.

The present invention furthermore relates to the use of the compositions according to the invention for the treatment of diseases. The present invention still furthermore relates to the use of the compositions according to the invention for the treatment of cosmetic conditions.

Many diseases are associated with cosmetic aspects. Thus, a patient with severe acne on the face suffers not only from the medical causes and consequences of the disease, but also from the cosmetic accompanying circumstances.

Phototherapy or light therapy is used in many medical and/or cosmetic areas. The compositions according to the invention and the devices comprising these compositions can therefore be employed for the therapy and/or prophylaxis and/or diagnosis of all diseases and/or in cosmetic applications for which the person skilled in the art considers the use of phototherapy. Besides photodynamic therapy (PDT), the term phototherapy also includes disinfection in general. Accordingly, phototherapy or light therapy can be used for the treatment of not only humans or animals, but also any other type of living or non-living materials. These include, for example, fungi, bacteria, microbes, viruses, eukaryotes, prokaryonts, foods, drinks, water and drinking water.

Besides PDT, the term phototherapy also includes any type of combination of light therapy and other types of therapy, such as, for example, treatment with active compounds. Many light therapies have the aim of irradiating or treating exterior parts of an object, such as the skin of humans and animals, wounds, mucous membranes, the eye, hair, nails, the nail bed, gums and the tongue. However, the treatment or irradiation according to the invention can also be carried out inside an object in order, for example, to treat internal organs (heart, lung, etc.) or blood vessels or the breast.

The therapeutic and/or cosmetic areas of application according to the invention are preferably selected from the group of skin diseases and skinassociated diseases or changes or conditions, such as, for example, psoriasis, skin ageing, skin wrinkling, skin rejuvenation, enlarged skin pores, cellulite, oily/greasy skin, folliculitis, actinic keratosis, precancerous actinic keratosis, skin lesions, sun-damaged and sun-stressed skin, crows' feet, skin ulcers, acne, acne rosacea, scars caused by acne, acne bacteria, photomodulation of greasy/oily sebaceous glands and their surrounding tissue, jaundice, jaundice of the newborn, vitiligo, skin cancer, skin tumours, Crigler-Najjar, dermatitis, atopic dermatitis, diabetic skin ulcers.

Particular preference is given for the purposes of the invention to the treatment and/or prophylaxis of psoriasis, acne, cellulite, skin wrinkling and vitiligo.

Further areas of application according to the invention for the compositions and/or devices comprising the compositions according to the invention are selected from the group of inflammatory diseases, rheumatoid arthritis, pain therapy, treatment of wounds, neurological diseases and conditions, oedema, Paget's disease, primary and metastasising tumours, connectivetissue diseases or changes, changes in the collagen, fibroblasts and cell level originating from fibroblasts in tissues of mammals, irradiation of the retina, neovascular and hypertrophic diseases, allergic reactions, irradiation of the respiratory tract, sweating, ocular neovascular diseases, viral infections, particularly infections caused by herpes simplex or HPV (human papillomaviruses) for the treatment of warts and genital warts.

Particular preference is given for the purposes of the invention to the treatment and/or prophylaxis of rheumatoid arthritis, viral infections and pain.

Further areas of application according to the invention for the compositions and/or devices comprising the compositions according to the invention are selected from winter depression, sleeping sickness, irradiation for improving the mood, the reduction in pain particularly muscular pain caused by, for example, tension, elimination of the stiffness of joints and the whitening of the teeth (bleaching).

Further areas of application according to the invention for the compositions and/or devices comprising the compositions according to the invention are selected from the group of disinfections. The compositions according to the invention and/or the devices according to the invention can be used for the treatment of any type of objects (non-living materials) or subjects (living materials such as, for example, humans and animals) for the purposes of disinfection. This includes, for example, the disinfection of wounds, the reduction in bacteria, the disinfection of surgical instruments or other articles, the disinfection of foods, of liquids, in particular water, drinking water and other drinks, the disinfection of mucous membranes and gums and teeth. Disinfection here is taken to mean the reduction in the living microbiological causative agents of undesired effects, such as bacteria and germs.

For the purposes of the phototherapy mentioned above, the compositions according to the invention and/or the devices according to the invention preferably emit light having a wavelength between 250 and 1000 nm, particularly preferably between 300 and 1000 nm and especially preferably between 300 and 950 nm.

It should be pointed out that variations of the embodiments described in the present invention fall within the scope of this invention. Each feature disclosed in the present invention can, unless explicitly excluded, be replaced by alternative features which serve the same, an equivalent or a similar purpose. Thus, each feature disclosed in the present invention should, unless stated otherwise, be regarded as an example of a generic series or as an equivalent or similar feature.

All features of the present invention can be combined with one another in any way, unless certain features and/or steps are mutually exclusive. This applies, in particular, to preferred features of the present invention. Equally, features of non-essential combinations can be used separately (and not in combination).

It should furthermore be pointed out that many of the features, and in particular those of the preferred embodiments of the present invention, should be regarded as inventive themselves and not merely as part of the embodiments of the present invention. Independent protection may be granted for these features in addition or as an alternative to each invention claimed at present.

The teaching regarding technical action disclosed with the present invention can be abstracted and combined with other examples.

The invention is explained in greater detail by the following examples and figures without wishing it to be restricted thereby.

FIG. 1: Typical structure of an OLED, where the hole-injection layer (HIL) is also called the buffer layer.

Figure 2:
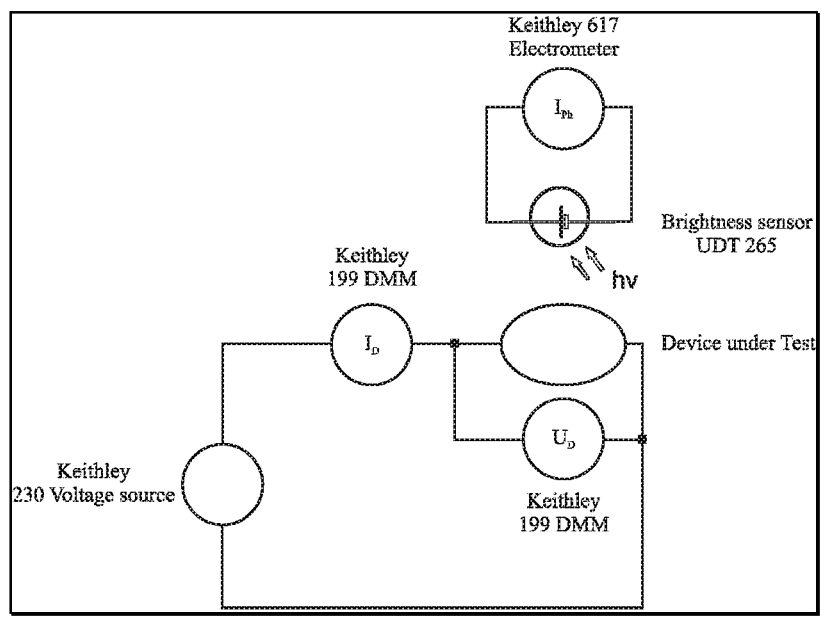

FIG. 2: Typical measurement set-up for characterisation of an OLED. The OLEDs are clamped into a holder and provided with spring contacts. A photodiode with eye response filter can be attached directly to the measurement holder in order to exclude influences by extraneous light.

EXAMPLES

The formulae of compounds V1 to V6 prepared in Examples 1 to 6 are depicted below.

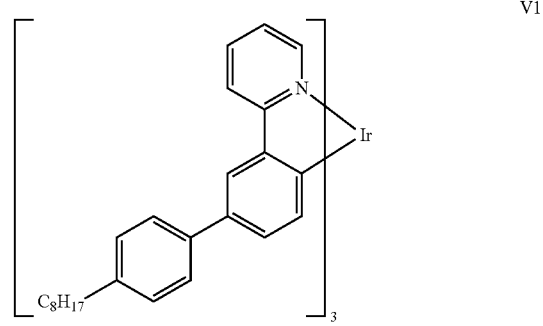

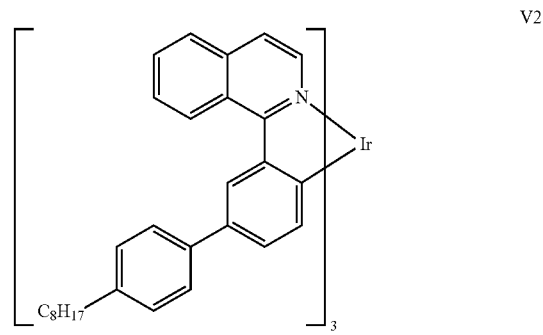

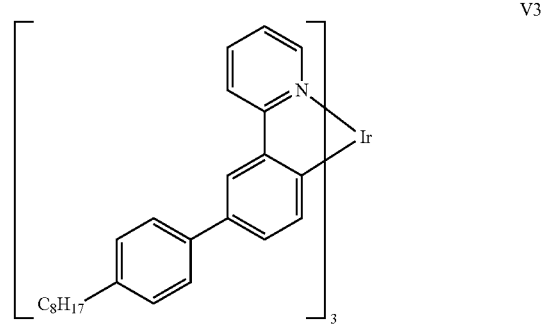

-continued

V4
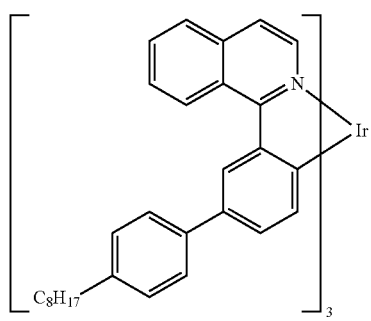

V5
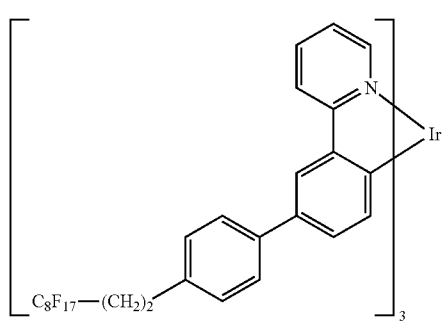

V6
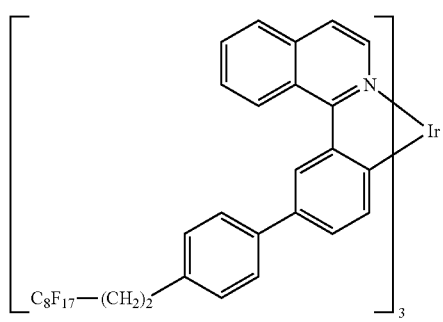

Material:

The following compound (TM1) is used as triplet matrix in combination with the compounds of the formula V1 to V6.

TM1
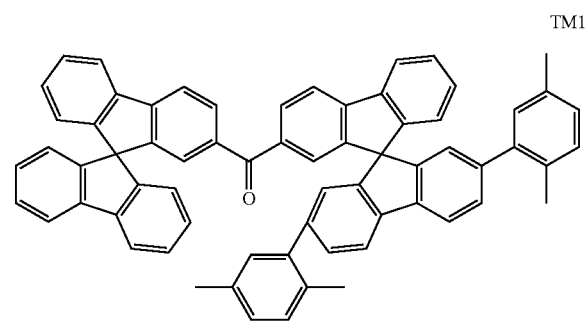 [SMILES: Cc1ccc(C)c(-c2ccc3c(c2)C2(c4ccccc4-c4ccc(C(=O)c5ccc6c(c5)C5(c7ccccc7-c7ccccc75)c5ccccc5-6)cc42)c2cc(-c4cc(C)ccc4C)ccc2-3)c1]

Example 1

Preparation of Compound V1

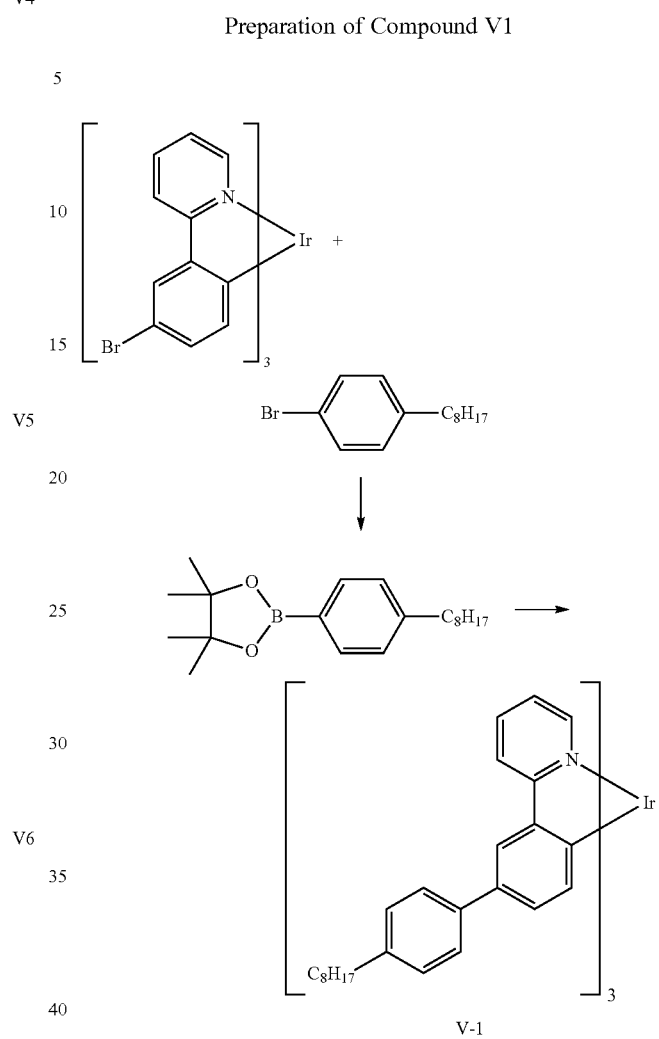

a) Synthesis of 4-bromophenyl 1-pinacolylboronate 50.0 g (186 mmol) of 4-n-octyl bromide, 51.9 g (204 mmol) of bispinacolatodiboron, 52.9 g (539 mmol) of potassium acetate are suspended in 800 ml of dimethyl sulfoxide. 4.55 g (5.6 mmol) of 1,1-bis(diphenylphosphino)ferrocenedichloropalladium(II)*DCM are added to this suspension, and the reaction mixture is heated under reflux for 16 h. After cooling, 600 ml of ethyl acetate and 400 ml of water are added, and the organic phase is separated off, washed three times with 200 ml of water, dried using sodium sulfate and subsequently evaporated to dryness. The crude product is recrystallised from heptane and finally dried under reduced pressure. The yield is 48.2 g (152 mmol), corresponding to 82.0% of theory.

b) Synthesis of tris[4'-n-octyl-3-(2-pyridinyl-κN)[1,1'-biphenyl]-4-yl-κC]-iridium (III) (compound V1)

3.4 g (4.0 mmol) of fac-tris[2-(2-pyridinyl-κN)(5-bromophenyl)-κC]-iridium(III), 10.8 g (34 mmol) of 4-bromophenyl 1-pinacolylboronate, 5.02 g (24 mmol) of potassium phosphate are suspended in 100 ml of toluene, 100 ml of dioxane and 111 ml of water. 4 mg (0.02 mmol) of palladium(II) acetate and 35 mg (1.1 mmol) of o-tritolyl-phosphine are added to this suspension, and the reaction mixture is heated under reflux for 24 h. After cooling, the organic phase is separated off, washed three times with 200 ml of water, filtered through silica gel, dried using sodium sulfate and subsequently evaporated to dryness. The residue is recrystallised from dioxane/ethanol and finally dried under reduced pressure. The yield is 3.64 g (3 mmol), corresponding to 78.0% of theory.

Example 2 to 6

Preparation of Compounds V2 to V6

The following compounds V2 to V6 according to the invention are obtained analogously to the synthesis, described in Example 1, of compound V1 from fac-tris[2-(2-pyridinyl-κN)(5-bromophenyl)-κC]iridium(III) or fac-tris[2-(1-isoquinolinyl-κN)(5-bromophenyl)-κC]iridium(III) and the corresponding boronates:

| Ex. | Boronic acid | Product | Yield |
|---|---|---|---|
| V2 | (pinacol boronate with C8H17-phenyl) | Ir complex with isoquinoline, C8H17-phenyl, tris | 75% |
| V3 | (pinacol boronate with C8F17-phenyl) | Ir complex with pyridine, C8F17-phenyl, tris | 65% |
| V4 | (pinacol boronate with C8F17-phenyl) | Ir complex with isoquinoline, C8F17-phenyl, tris | 60% |
| V5 | (pinacol boronate with (CH2)2—C8H17-phenyl) | Ir complex with pyridine, C8F17—(CH2)2-phenyl, tris | 71% |

| Ex. | Boronic acid | Product | Yield |
|---|---|---|---|
| V6 | 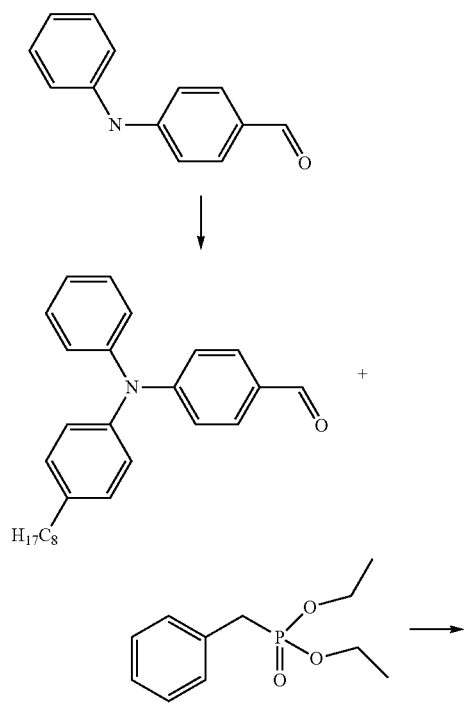 | | 73% |

Example 7

Preparation of Compound V7 a) Synthesis of 4-(4-n-octylphenylphenylamino)benzaldehyde 50.0 g (254 mmol) of 4-phenylaminobenzaldehyde, 75.1 g (279 mmol) of p-bromo-n-octylphenyl and 73.1 g (760 mmol) of NaOtBu are suspended in 1 l of p-xylene. 1.1 g (5 mmol) of Pd(OAc)$_2$ and 3.8 ml of a 1M tri-tert-butylphosphine solution are added to this suspension. The reaction mixture is heated under reflux for 16 h. After cooling, the organic phase is separated off, washed three times with 200 ml of water and subsequently evaporated to dryness. The residue is extracted with hot toluene, and employed in the subsequent reaction without further purification. The yield is 81.7 g (212 mmol, 83.6%)

b) Synthesis of Compound V7

6.0 g (26 mmol) of diethyl (phenyl)methylphosphonate are initially introduced in 70 ml of DMF, 5.54 g of sodium tert-butoxide (58 mmol) are added at about 0° C. under protective gas, and, after a stirring time of 40 minutes at 0° C., a solution of 10.1 g (26 mmol) of 4-(4-n-octylphenyl-phenylamino)benzaldehyde in 40 ml of DMF is slowly added dropwise at 0° C. After 2 hours, ethanol and water are added dropwise at 5° C., the mixture is stirred overnight at room temperature, and the batch is subsequently extracted by shaking with DCM. The organic phases are separated, washed with water, dried and evaporated in a rotary evaporator. After recrystallisation from acetonitrile, the product is obtained in the form of a slightly yellowish powder. The yield is 9.0 g (20 mmol, 74.5%).

Example 8

Preparation of Compound V8

Compound V8 is obtained analogously to the synthesis of compound V7 described in Example 7.

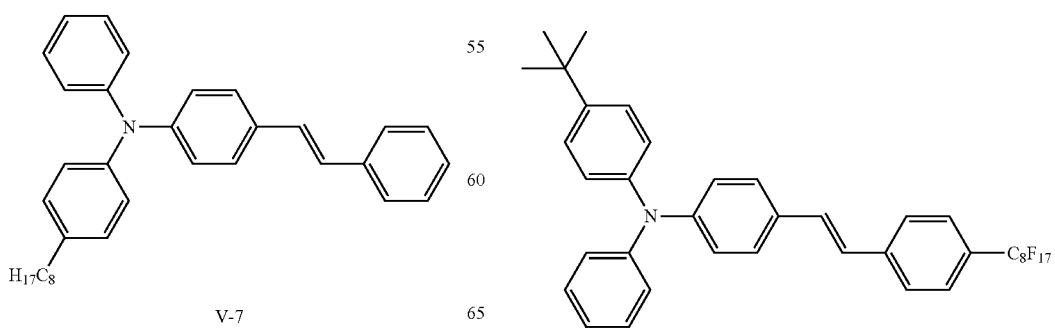

Example 9

Preparation of Polymers P1, P2 and P3

Polymers P2 and P3 and comparative polymer P1 are synthesised by SUZUKI coupling in accordance with WO 2003/048225 A2 using the following monomers (percent data correspond to mol %).

Polymer P1 - comparative polymer

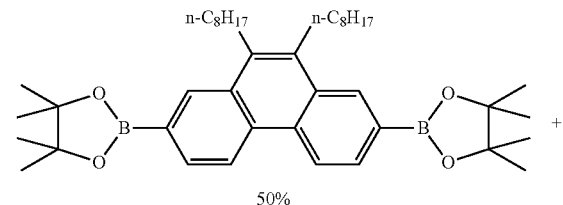

50%

+

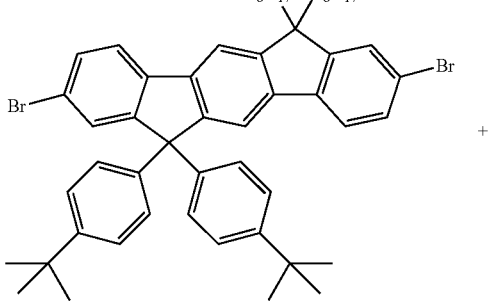

45%

+

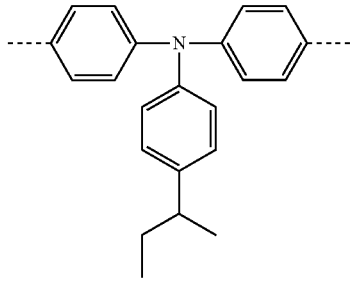

5%

Polymer P2

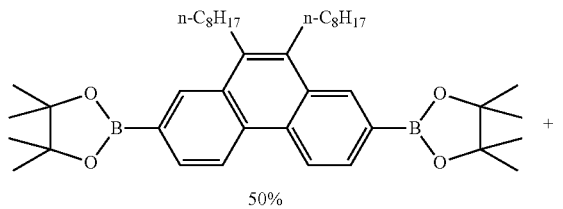

50%

+

-continued

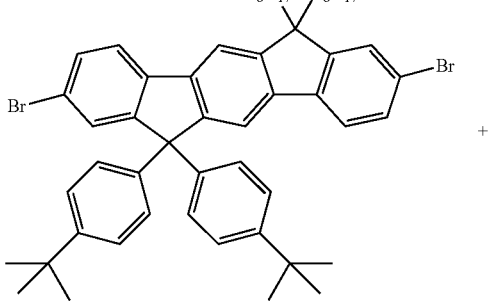

45%

+

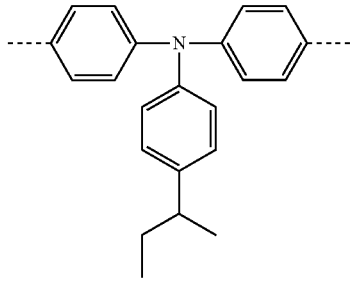

5%

Polymer P3 - interlayer polymer

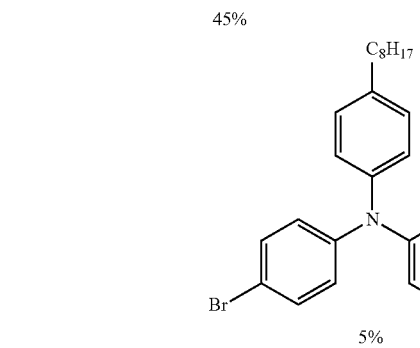

50%

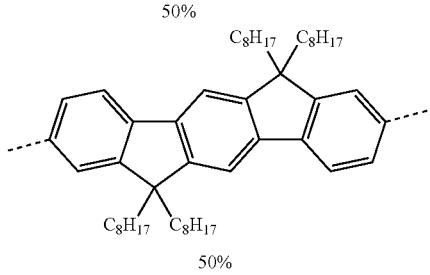

50%

Example 10

Production of OLEDs

The production of an organic light-emitting diode from solution has already been described many times in the literature (for example in WO 2004/037887 A2). In order to explain the present invention by way of example, triplet OLEDs having various combinations of compounds V1 to V6 and matrix TM1 and OLEDs comprising combinations consisting of compounds V7 and V8 and P1 and P2 are produced by means of spin coating.

A typical OLED has the structure depicted in FIG. 1, where the hole-injection layer (HIL) is also called the buffer layer.

The OLEDs are produced using substrates from Technoprint (soda-lime glass) to which ITO (indium tin oxide, a transparent, conductive anode) is applied.

The substrates are cleaned in a clean room with DI water and a detergent (Deconex 15 PF) and subsequently activated by UV/ozone plasma treatment. 80 nm of a buffer layer comprising PEDOT (polythiophene derivative (Baytron P VAI 4083sp.) from H. C. Starck, Goslar, which is supplied as an aqueous dispersion) are then applied by spin coating, likewise in the clean room. The requisite spin rate depends on the degree of dilution and the specific spin-coater geometry (for 80 nm, typically 4500 rpm). In order to remove residual water from the layer, the substrates are dried by heating on a hotplate at 180° C. for 10 minutes. Then, firstly 20 nm of an interlayer (typically a hole-dominated polymer, here P3) and then 80 nm (for redemitting layer) or 65 nm (for blue-emitting layer) of the emitter-containing layers (EML for emissive layer) from solutions (concentration of P3 is 5 g/l in toluene; the compositions of the various EMLs, and the corresponding concentrations are listed in Table 1) are listed under an inert-gas atmosphere (nitrogen or argon). All EML layers are dried by heating at 180° C. for at least 10 minutes. The Ba/Al cathode is then applied by vapour deposition (highly pure metals from Aldrich, in particular barium 99.99%); vapour-deposition units from Lesker or others, typical vacuum level $5\times10^6$ mbar). In order to protect, in particular, the cathode against air and atmospheric moisture, the device is finally encapsulated and then characterised.

The OLEDs are summarised in Table 2, where OLED1 and OLED4 serve for comparison and OLED2, OLED3 and OLED5 represent the diodes according to the invention.

TABLE 1

| Composition of EML [wt %] | | Solvent | Concentration [mg/ml] |
|---|---|---|---|
| OLED1 | 80% TMM1:10% V1:10% V2 | chlorobenzene | 24 |
| OLED2 | 80% TMM1:10% V3:10% V4 | chlorobenzene | 24 |
| OLED3 | 80% TMM1:10% V5:10% V6 | chlorobenzene | 24 |
| OLED4 | 93% P1:7% V7 | toluene | 10 |
| OLED5 | 93% P2:7% V8 | toluene | 10 |

Example 11

Characterisation of the OLEDs

In order to characterise the OLEDs, the latter are clamped into holders manufactured especially for the substrate size and provided with spring contacts. A photodiode with eye response filter can be attached directly to the measurement holder in order to exclude influences by extraneous light. A typical measurement set-up is depicted in FIG. 2.

The voltages are typically increased from 0 to max. 20 V in 0.2 V steps and reduced again. For each measurement point, the current through the device and the photocurrent obtained from the photodiode is measured. In this way, the IVL data of the test devices are obtained. Important characteristic quantities are the measured maximum efficiency ("eff." in cd/A) and the voltage $U_{100}$ required for 100 cd/m².

In order, in addition, to know the colour and the precise electroluminescence spectrum of the test devices, the voltage required for 100 cd/m² is again applied after the first measurement, and the photodiode is replaced by a spectrum measuring head. This is connected to a spectrometer (Ocean Optics USB2000) by an optical fibre. The colour coordinates (CIE: Commission International de l'éclairage, 1931 standard observer) can be derived from the measured spectrum.

In addition, the EQE is also calculated. EQE is an abbreviation and stands for the term "external quantum efficiency". EQE is defined by the number of photons coming from the device divided by the electrons flowing into the device. The theoretical maximum EQE for singlet OLEDs is typically at about 5% and for triplet OLEDs at a max. about 20%.

The results of the characterisation are summarised in Table 2.

TABLE 2

| | Max. eff. [cd/A] | Uon [V] | U(100) [V] | CIE @ 100 cd/m² | Max. EQE |
|---|---|---|---|---|---|
| OLED1 | 2.94 | 3.4 | 5.8 | 0.66/0.34 | 3.07% |
| OLED2 | 4.70 | 3.2 | 5.4 | 0.66/0.34 | 4.63% |
| OLED3 | 4.22 | 3.1 | 5.1 | 0.66/0.34 | 3.79% |
| OLED4 | 1.34 | 4.4 | 7.1 | 0.14/0.15 | 1.09% |
| OLED5 | 3.37 | 3.6 | 5.8 | 0.14/0.15 | 2.75% |

As can be seen from the results, OLED2 and OLED3 represent a significant improvement over OLED1 with respect to the efficiency. The same also applies to OLED4 and OLED5. This is caused by the emitting units in OLED2, OLED3 and OLED5 which are closely connected by the F-F interaction (energy transfer by Förster mechanism). Further optimisations can be achieved by different means on the basis of the present technical teaching according to the invention without being inventive. Thus, a further optimisation can be achieved, for example through the use of other emitters in the same or a different concentration.

The invention claimed is:

1. A composition comprising a light-emitting compound M1 and at least one light-emitting compound M2, wherein M1 and M2 are different from each other and are each a fluorinated metal complex phosphorescent emitter comprising a ligand of any of the following compounds (I-1) to (I-8)

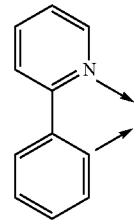

(I-1)

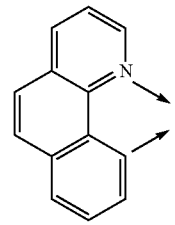

(I-2)

-continued (I-3) 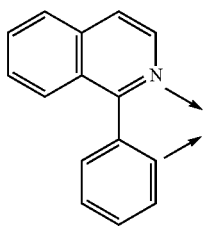

(I-4) 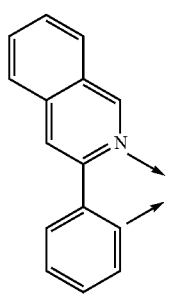

(I-5) 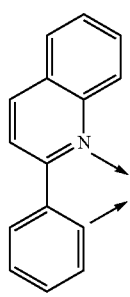

(I-6) 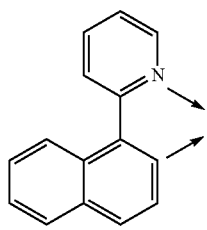

(I-7) 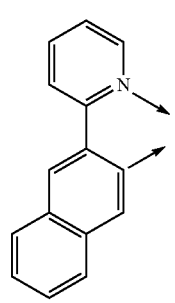

-continued (I-8) 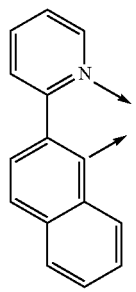

wherein the atoms from which the arrows point away are coordinated to a metal atom, and where the positions not coordinated to the metal atom, independently of one another, may have a substituent, provided at least one of the positions not coordinated to the metal atom comprises a fluorine radical;

wherein the metal atom is Ir;

wherein the fluorine radical is a perfluorinated alkyl group having 5 to 15 C atoms, wherein the fluorine radical may be bonded to the ligand via a spacer, and wherein either the absorption spectrum of M1 overlaps with the emission spectrum of M2 or the absorption spectrum of M2 overlaps with the emission spectrum of M1, at least with one of its absorption and emission bands.

2. The composition of claim 1, wherein said composition comprises at least one unfluorinated organic host compound.

3. The composition of claim 2, wherein the organic host compound is a low-molecular-weight compound, dendrimer, oligomer or polymer.

4. The composition of claim 1, wherein the molar ratio M1:M2 is 0.01:1 to 1:0.01.

5. A process for preparing the composition of claim 1, comprising the step of:

a) preparing a solution comprising the light-emitting compound M1 and the light-emitting compound M2 in a solvent L1.

6. The process of claim 5, further comprising the steps of:

b) preparing a solution comprising an organic host compound in a solvent L2; and c) mixing the two solutions prepared in steps a) and b) together.

7. The process of claim 6, wherein L1 and L2 are identical or miscible with one another.

8. An organic electronic device comprising a cathode, an anode and at least one organic layer, wherein the organic layer comprises the composition of claim 1.

9. The organic electronic device of claim 8, wherein the device is selected from the group consisting of organic electroluminescent devices, organic field-effect transistors, organic thin-film transistors, organic light-emitting transistors, organic integrated circuits, organic solar cells, dye-sensitised organic solar cells, organic optical detectors, organic photoreceptors, organic field-quench devices, organic light-emitting electrochemical cells, organic laser diodes, and organic plasmon emitting devices.

10. The composition of claim 1, wherein M1 or M2 is selected from any of the compounds V3 to V6

V3
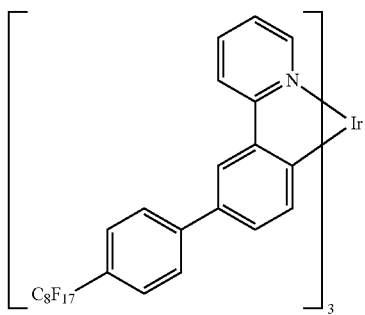
V4
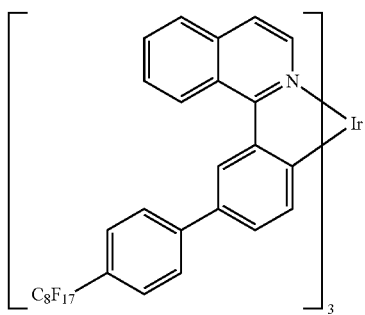
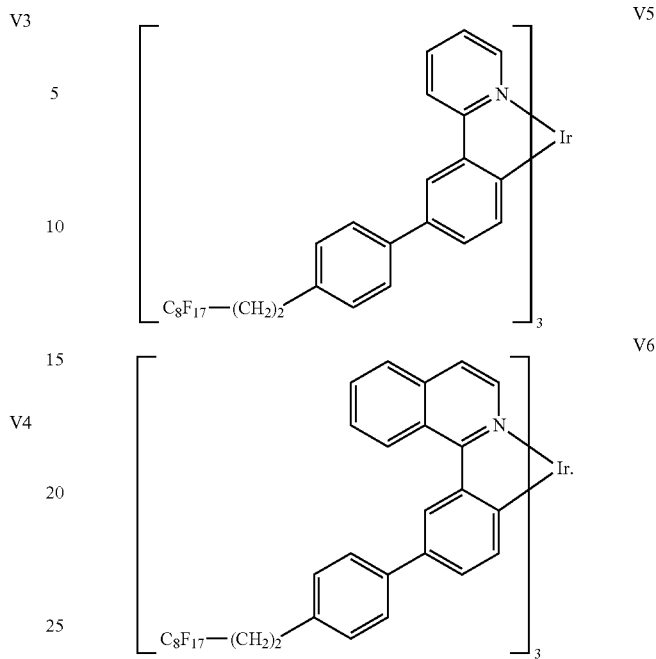
11. The composition of claim 1, wherein the molar ratio M1:M2 is 1:1.
* * * * *